US011533777B2

(12) United States Patent
Pennington et al.

(10) Patent No.: US 11,533,777 B2
(45) Date of Patent: Dec. 20, 2022

(54) CELL SITE ARCHITECTURE THAT SUPPORTS 5G AND LEGACY PROTOCOLS

(71) Applicant: AT&T Intellectual Property I, L.P., Atlanta, GA (US)

(72) Inventors: Monica Pennington, Kansas City, MO (US); Anju Bhagat, Morganville, NJ (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 48 days.

(21) Appl. No.: 16/023,622

(22) Filed: Jun. 29, 2018

(65) Prior Publication Data
US 2020/0008271 A1   Jan. 2, 2020

(51) Int. Cl.
*H04W 88/08* (2009.01)
*H04L 69/08* (2022.01)
*H04W 88/18* (2009.01)
*H03M 1/00* (2006.01)
(Continued)

(52) U.S. Cl.
CPC ......... *H04W 88/085* (2013.01); *H03M 1/001* (2013.01); *H04L 69/08* (2013.01); *H04W 28/065* (2013.01); *H04W 88/181* (2013.01); *H04L 2212/00* (2013.01); *H04W 16/14* (2013.01)

(58) Field of Classification Search
CPC ............. H04W 28/065; H04W 88/085; H04W 88/181; H03M 1/001; H04L 69/18; H04L 69/08
See application file for complete search history.

(56) References Cited

U.S. PATENT DOCUMENTS

| 9,571,388 B1 | 2/2017 | Ward et al. |
| 9,892,007 B2 | 2/2018 | Yang et al. |
| 9,923,807 B2 | 3/2018 | Kodaypak et al. |
| (Continued) | | |

FOREIGN PATENT DOCUMENTS

| CN | 106411664 A | 2/2017 |
| WO | 2017/051172 A1 | 3/2017 |
| (Continued) | | |

OTHER PUBLICATIONS

Jones, "AT&T Preps White Box Routers for 5G," Mar. 27, 2018, Light Reading, 6 pages.
(Continued)

*Primary Examiner* — Jason E Mattis
*Assistant Examiner* — Bao G Nguyen
(74) *Attorney, Agent, or Firm* — Amin, Turocy & Watson, LLP

(57) ABSTRACT

In modern networks, RRU and BBU equipment of an access point site typically handles traffic from a single sector. An RRU-BBU pair process that traffic (often limited to a single spectrum from a single sector) according to implemented capabilities and other equipment located further upstream perform functions that rely on information from multiple sectors. An integrated device (e.g., white box) can integrate the functionality of multiple RRU (or NR in 5G) and the functionality of multiple BBU (or DU/CU splits in 5G), which can reduce implementation footprint, costs, and can provide related services more efficiently without going upstream.

20 Claims, 15 Drawing Sheets

(51) Int. Cl.
*H04W 28/06* (2009.01)
*H04W 16/14* (2009.01)

(56) References Cited

U.S. PATENT DOCUMENTS

| | | | |
|---|---|---|---|
| 9,949,133 B2 | 4/2018 | Ashrafi | |
| 9,949,138 B2 | 4/2018 | Zavesky et al. | |
| 2011/0158160 A1* | 6/2011 | McCullough | H04L 69/169 370/328 |
| 2013/0279452 A1* | 10/2013 | Liu | H04W 72/1268 370/329 |
| 2015/0200838 A1 | 7/2015 | Nadeau et al. | |
| 2015/0244624 A1* | 8/2015 | Asiano | H04B 7/155 370/235 |
| 2016/0020987 A1 | 1/2016 | Wetterwald et al. | |
| 2016/0072717 A1* | 3/2016 | Ansari | H04L 45/24 370/412 |
| 2016/0127440 A1 | 5/2016 | Gordon | |
| 2016/0174128 A1* | 6/2016 | Oren | H04L 12/189 370/338 |
| 2016/0192370 A1* | 6/2016 | Chan | H04W 76/14 370/329 |
| 2016/0309491 A1 | 10/2016 | Dai et al. | |
| 2017/0070387 A1 | 3/2017 | Rao et al. | |
| 2017/0070892 A1 | 3/2017 | Song et al. | |
| 2017/0085493 A1 | 5/2017 | Senarath et al. | |
| 2017/0134287 A1 | 5/2017 | Shaw et al. | |
| 2017/0142206 A1 | 5/2017 | Kodaypak et al. | |
| 2017/0208011 A1 | 7/2017 | Bosch et al. | |
| 2017/0104651 A1 | 8/2017 | Kakadia et al. | |
| 2017/0235585 A1 | 8/2017 | Gupta et al. | |
| 2017/0245187 A1 | 8/2017 | Iwai | |
| 2017/0257276 A1 | 9/2017 | Chou et al. | |
| 2017/0257870 A1 | 9/2017 | Farmanbar et al. | |
| 2017/0295409 A1 | 10/2017 | Simon et al. | |
| 2017/0332421 A1 | 11/2017 | Sternberg et al. | |
| 2017/0339706 A1 | 11/2017 | Andreoli-fang et al. | |
| 2018/0001206 A1 | 1/2018 | Osman et al. | |
| 2018/0007737 A1 | 1/2018 | Noriega et al. | |
| 2018/0014214 A1* | 1/2018 | Arena | H04L 45/74 |
| 2018/0041436 A1 | 2/2018 | Zhang | |
| 2018/0041437 A1* | 2/2018 | Nishijima | H04L 47/125 |
| 2018/0062938 A1 | 3/2018 | Garrison et al. | |
| 2018/0069786 A1 | 3/2018 | Lokman et al. | |
| 2018/0076914 A1* | 3/2018 | Zhou | H04L 41/0843 |
| 2018/0139073 A1* | 5/2018 | Han | H04L 45/745 |
| 2018/0145757 A1 | 5/2018 | Weeber et al. | |
| 2018/0227243 A1 | 8/2018 | Zhang et al. | |
| 2018/0227244 A1 | 8/2018 | Zhang et al. | |
| 2018/0254982 A1 | 9/2018 | Apostolopoulos | |
| 2018/0262443 A1 | 9/2018 | Zhang et al. | |
| 2018/0302343 A1* | 10/2018 | Lokman | G06F 9/5077 |
| 2018/0302877 A1 | 10/2018 | Bosch et al. | |
| 2018/0310199 A1* | 10/2018 | Halabian | H04W 28/0289 |
| 2018/0310326 A1* | 10/2018 | Tanaka | H04W 72/0453 |
| 2018/0316799 A1 | 11/2018 | Shaw et al. | |
| 2018/0357810 A1 | 12/2018 | Young et al. | |
| 2018/0367498 A1 | 12/2018 | Bliss et al. | |
| 2018/0367997 A1 | 12/2018 | Shaw et al. | |
| 2019/0103993 A1 | 4/2019 | Cidon et al. | |
| 2019/0104442 A1* | 4/2019 | Witzel | H04W 36/08 |
| 2019/0150150 A1 | 5/2019 | Calin et al. | |
| 2019/0174276 A1 | 6/2019 | Mineiro Ramos de Azevedo | |
| 2019/0174433 A1 | 6/2019 | Nory et al. | |
| 2019/0182211 A1 | 6/2019 | Yang et al. | |
| 2019/0182290 A1 | 6/2019 | Haddad | |
| 2019/0182712 A1 | 6/2019 | Watanbae et al. | |
| 2019/0190686 A1 | 6/2019 | Ye et al. | |
| 2019/0246427 A1* | 8/2019 | Mukherjee | H04W 74/0808 |
| 2020/0008271 A1* | 1/2020 | Pennington | H04L 69/08 |

FOREIGN PATENT DOCUMENTS

| | | |
|---|---|---|
| WO | 2017/175606 A1 | 10/2017 |
| WO | 2017/175654 A1 | 10/2017 |
| WO | 2017/183284 A1 | 10/2017 |
| WO | 2017/200978 A1 | 11/2017 |
| WO | 2017/222595 A2 | 12/2017 |
| WO | 2018/036517 A1 | 3/2018 |
| WO | 2018/058687 A1 | 4/2018 |
| WO | 2018/060674 A1 | 4/2018 |
| WO | 2018/061601 A1 | 4/2018 |

OTHER PUBLICATIONS

"Virtualisation A flexible route to optimise your network," Zeetta Networks, 2 pages. Retrieved on Apr. 27, 2018.

Suleiman et al., "Marvell to Demonstrate CyberTAN White Box Solution Incorporating the Marvell ARMADA 8040 SoC Running Telco Systems NFVTime Universal CPE OS at Mobile World Congress 2018," Feb. 22, 2018, 4 pages.

Chimeh et al., "Approaching to Mobile 5G Communications," International Conference on Innovative Mobile and Internet Services in Ubiquitous Computing, Jul. 5, 2017, pp. 647-656.

Kaltenberger et al., "From massive MIMO to C-RAN: the OpenAirInterface 5G testbed," Asilomar Conference on Signals, Systems, and Computers, 2017, 5 pages.

Non-Final Office Action received for U.S. Appl. No. 16/025,301 dated Nov. 19, 2019, 24 pages.

Non-Final Office Action received for U.S. Appl. No. 16/025,301 dated Jul. 8, 2019, 26 pages.

* cited by examiner

CELL SITE ARCHITECTURE THAT SUPPORTS 5G AND LEGACY PROTOCOLS

TECHNICAL FIELD

The present application relates generally to an architecture for an access point site (e.g., cell site, base transceiver station, etc.) that can support fifth generation (5G) standards and provide compatibility with legacy standards, as well as improving services thereof.

BACKGROUND

Proposals for 5G include many changes from previous architectures such as the architectures of long term evolution and other legacy standards. For example, compliance with 5G relies on a disaggregation of the baseband unit (BBU) utilized in legacy architectures. In that regard, 5G has disaggregated functional aspects of the BBU, splitting the function of the BBU into two parts, referred to as a distributed unit (DU) and a centralized unit (CU). A first part of the functionality remains at the cell site and is handled by the DU. In some instances, the DU could be remotely located and multiple TRPs could connect to it. The virtualized capability is handled by the CU, which is processed elsewhere, typically in a cloud (edge or integrated) or the core network.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout, and in which.

DETAILED DESCRIPTION

Overview

Figure 1:
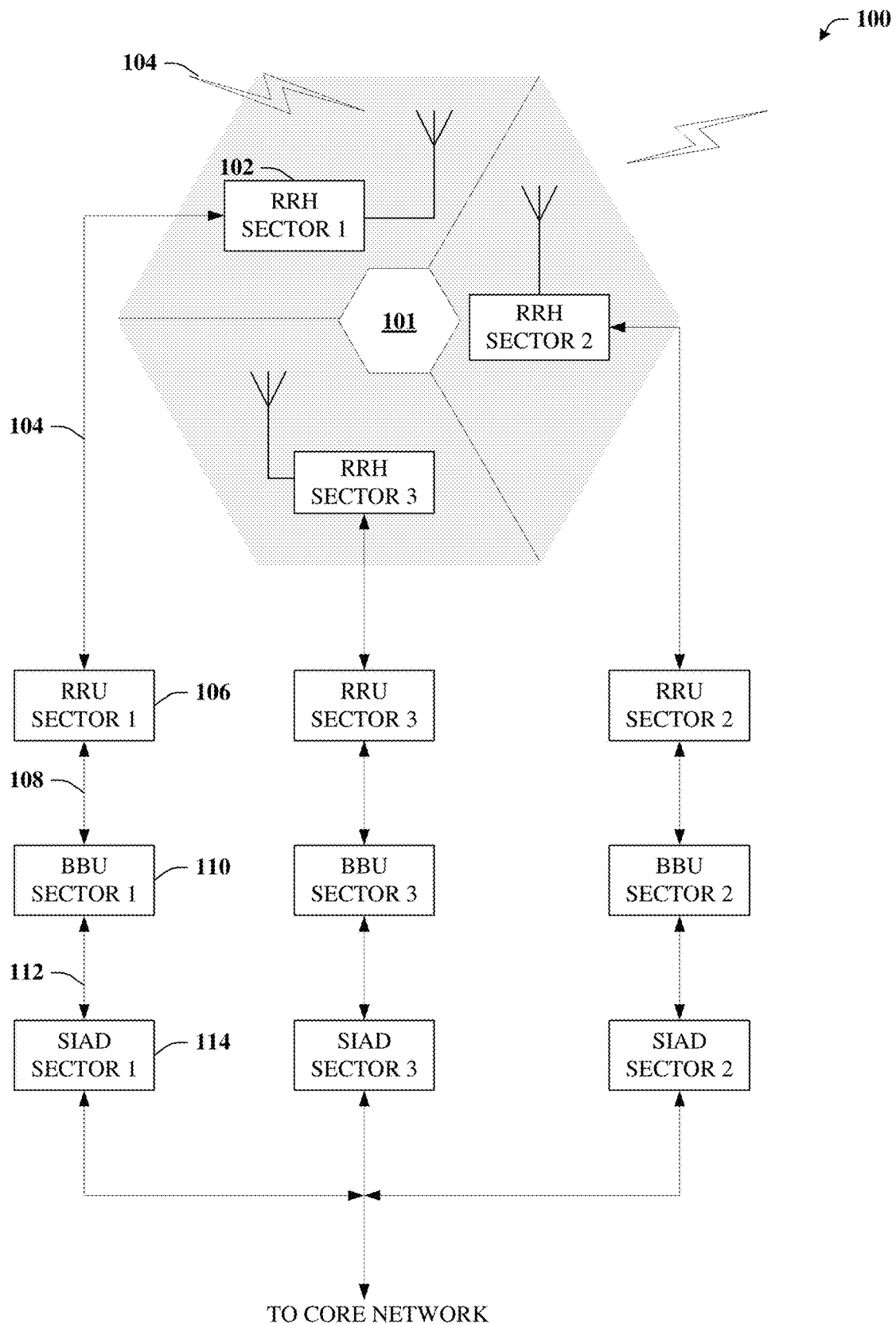
FIG. 1 depicts a block diagram illustrating an example LTE access point site architecture.

The disclosed subject matter is now described with reference to the drawings, wherein like reference numerals are used to refer to like elements throughout. In the following description, for purposes of explanation, numerous specific details are set forth in order to provide a thorough understanding of the disclosed subject matter. It may be evident, however, that the disclosed subject matter may be practiced without these specific details. In other instances, well-known structures and devices are shown in block diagram form in order to facilitate describing the disclosed subject matter.

In order to better understand the subject matter detailed herein, it can be instructive to consider conventional architectures that implement long term evolution (LTE) or other legacy cellular standards (e.g., 3G, 2G, etc.) and compare those to 5G proposals. For example, consider FIG. 1, depicting block diagram 100. Diagram 100 illustrates an example LTE access point site architecture. As used herein, "access point site" is intended to refer to a cell site, a base transceiver station (BTS), or the like in terms of structure or topology. An orthogonal (e.g., top-down) view of access point site 101 is presented. Services provided by access point site 101 are divided into three sectors, each of which is served by a remote radio head (RRH), a representative example of which is RRH 102 that serves sector 1. It is understood that a given cell can be divided into any number of sectors and any number of RRH devices can serve a given sector.

RRH 102 can be any suitable transceiver device configured to transmit or receive analog radio signal 104, such as to or from user equipment (UE) being served. For the sake of brevity, numerous descriptions here and throughout the remainder of this document describe elements in the context of uplink traffic, but it is understood similar concepts can be applied in the context of downlink traffic. The lower half of diagram 100 illustrates an example topological map for other elements of access point site 101. For example, once received by RRH 102, analog radio signal 104 can be provided to a corresponding remote radio unit (RRU), a representative example of which is RRU 106.

RRU 106 can represent a control/processing unit for a corresponding RRH (e.g., RRH 102). For example, RRU 106 can convert analog radio signal 104 to a digital signal 108 that is suitable for packet-based networks or components. Typically, digital signal 108 is formatted according to a common public radio interface (CPRI) protocol, which can be received by BBU 110. BBU 110 can, inter alia, perform encapsulation, routing, timing, or mapping functions for packets of digital signal 108. Encapsulated packets 112 can be provided to a smart integrated access device (SIAD) 114 and then forwarded to the core network or elsewhere. Hence, encapsulated packets 112 can be encapsulated according to an Ethernet protocol that is compliant with conventional LTE networks.

It is understood that conventional architectures maintain a one-to-one mapping between RRU 106, BBU 110, and SIAD 114. That is, RRU 106 is configured to support a single sector of the cell. Thus, a three-sector site typically must have at least three RRUs, three BBUs and three SIADs, at least one of each for each of the three sectors. Furthermore, RRU 106 is typically configured to process only a single frequency range or spectrum. If a corresponding RRH can support multiple spectrums and/or a given sector has multiple RRHs, then the number of devices and commensurate costs can grow proportionally.

Figure 2:
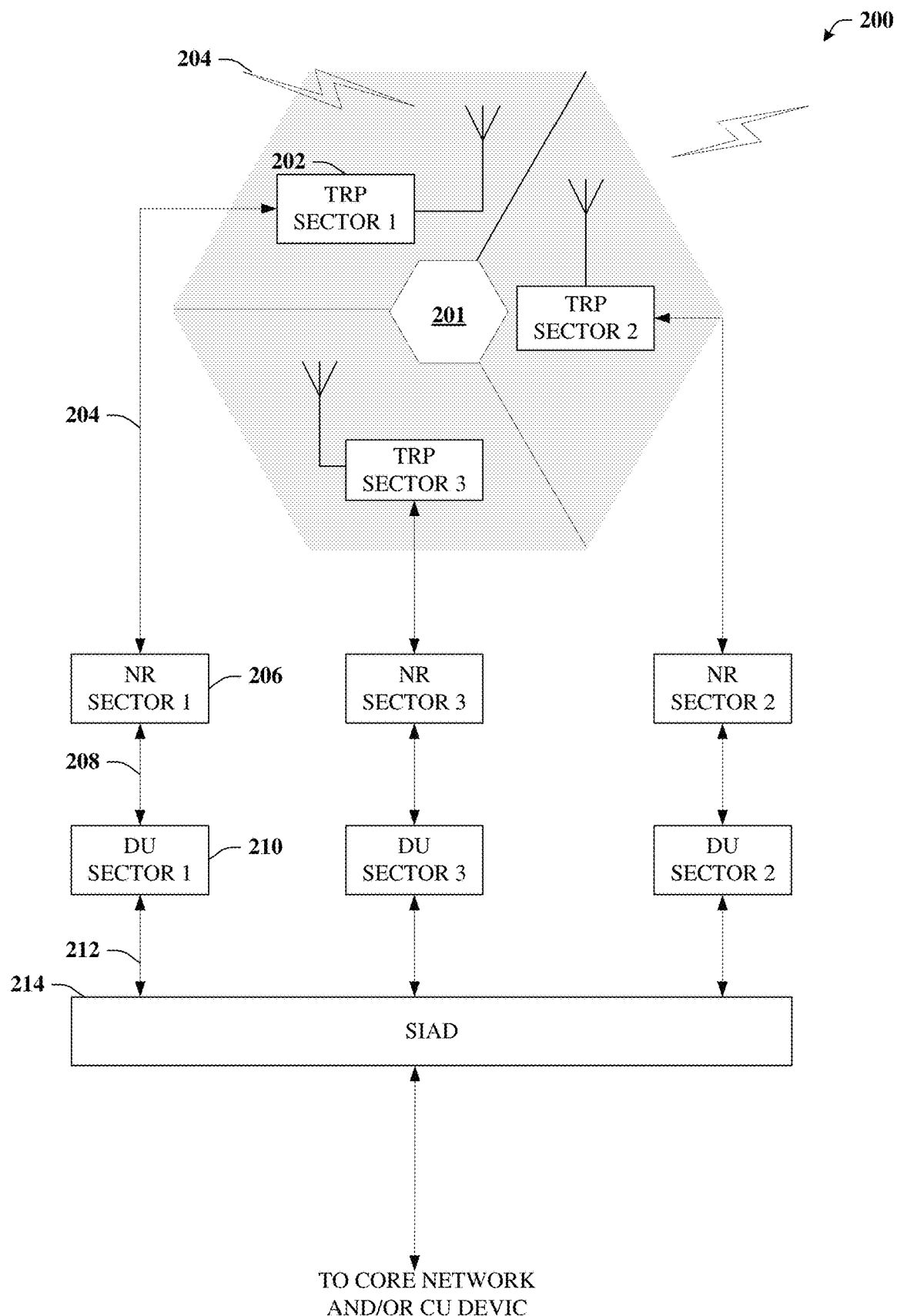
FIG. 2 is a block diagram illustrating an example 5G access point site architecture.

Proposals for 5G maintain a similar architecture, but introduce some differences that can provide many advantages, but can also be costly to implement. For example, consider FIG. 2, depicting block diagram 200. Diagram 200 illustrates an example 5G access point site architecture. It is noted that 5G proposals use different nomenclature or terminology, but often the functionality is the same or similar to like elements from LTE or others. For example, transmission/reception point (TRP) 202 can receive analog radio signal 204, similar to the functionality of RRH 102 in LTE architectures.

Similar to RRU 106, a new radio (NR) and/or a next generation RRU (NGRRU), a representative example of which is NR 206, can convert analog radio signal 204 to digital signal 208. In the case of 5G, however, digital signal 208 will not likely be formatted according to a CPRI protocol, but rather formatted according to an evolved common public radio interface (eCPRI) protocol which may or may not be encapsulated according to a radio-over-Ethernet (ROE) protocol, that is supported by 5G.

As noted previously, 5G proposes disaggregation of the functionality of the BBU into a DU located at the cell site, and a CU located in the cloud. Such disaggregation can allow the virtualization of the CU at a centralized location. In order to reach a tradeoff between benefits of centralization and fronthaul requirements on throughput and latency, several functional splits, referred to as splits 1-8, are considered by 5G proposals and other standardization bodies. A traditional functional split used for distributed base station architecture is called split 8 and splits with lower indices leave more functionality on the cell site, in the DU.

Regardless, DU 210 can provide encapsulated packets 212 (e.g., formatted according to an ROE protocol) to SIAD 214. While a one-to-one mapping exists between NR 206 and DU 210, each of which supports only a single sector, SIAD 214 can support multiple sectors. Hence, it can still be expensive and complex to organize service on a per-sector basis. Furthermore, because equipment utilized in 5G architectures is not fully compatible with legacy standards, a cell site that supports both 5G and LTE will likely require new equipment to support 5G and continued maintenance of existing equipment to support LTE and legacy standards.

While 5G is expected to provide significant benefits such as support for GHz bands, 5G proposes rigorous latency requirements. For example, substantial cloud infrastructure will need to be built up by providers, for example at edges nearby to many cell sites that intend to meet a split 8 design. In that regard, a cloud maintained by the provider may have enormous computational capacity, sufficient for all the needs of the entire network, but if the location of the cloud is remote, either geographically or topologically, such cloud infrastructure will not likely be sufficient to meet the latency requirements of 5G. Establishing additional cloud infrastructure at network edges that are geographically or topologically closer to cells sites can represent a significant expense. It should be understood that in some embodiments, TRP 202 can connect to DU 210 that is located off-site, such as at a central office (CO) or another suitable location or system.

Figure 3:
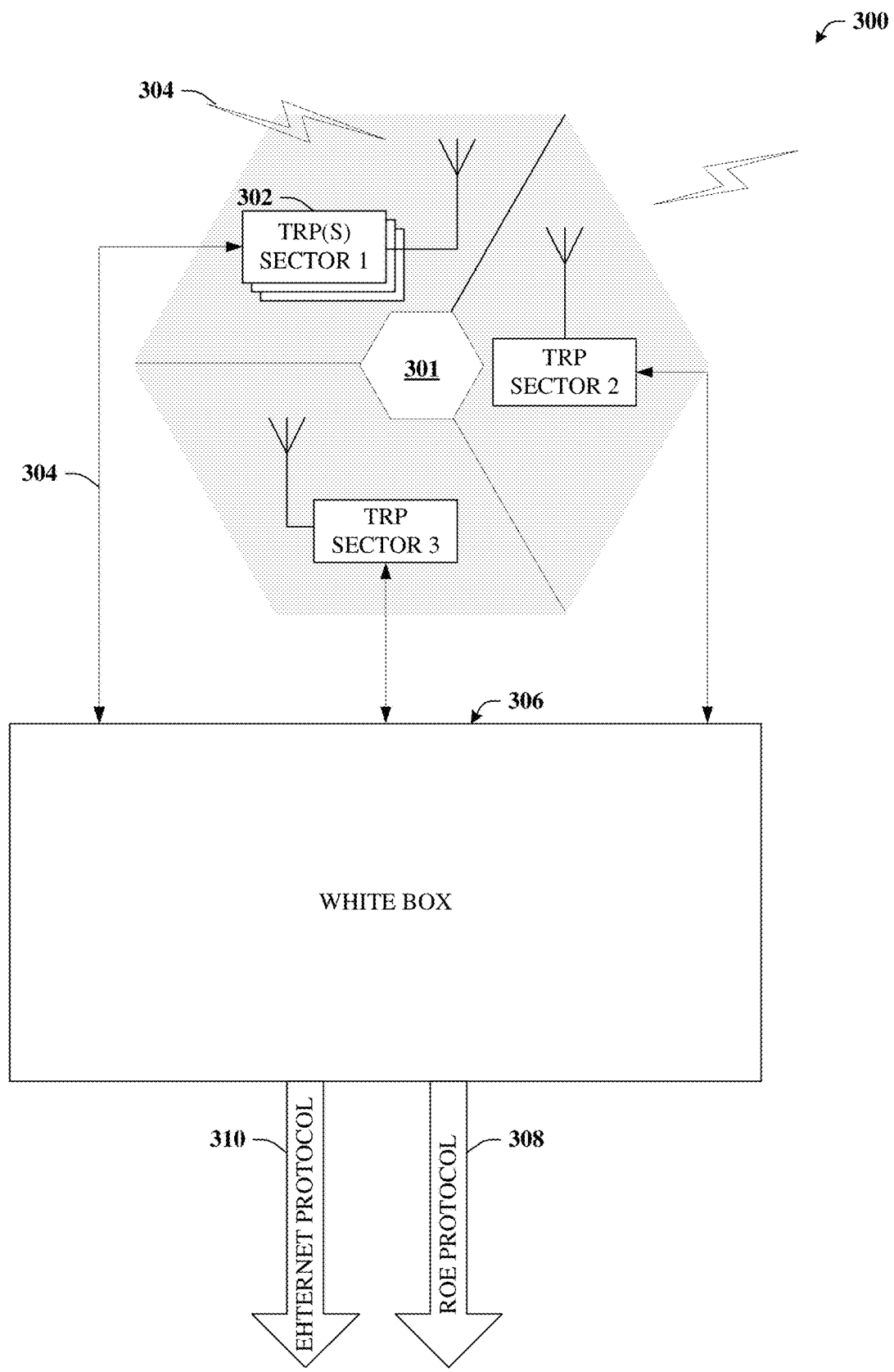
FIG. 3 depicts a block diagram of an example access point site architecture that can support 5G and legacy protocols in an efficient and cost-effective manner in accordance with certain embodiments of this disclosure.

With the above in mind, the disclosed subject matter can be described. Turning now to FIG. 3, block diagram 300 is depicted. Diagram 300 illustrates an example access point site architecture that can support 5G and legacy protocols in an efficient and cost-effective manner in accordance with certain embodiments of this disclosure. Access point site 301 have one or more TRP devices, a representative example is TRP 302. TRP 302 can be any suitable transceiver device such as RRH 102 or TRP 202. TRP 302 can receive analog radio signal 304 (e.g., from any suitable UE) and provide analog radio signal 304 to white box 306.

White box 306 can represent integration of packet processing, encapsulation as well as, in some embodiments, routing, mapping and other functionality. For example, white box 306 can provide the packet processing functionality of RRU 106 for LTE and legacy cellular communication and/or the packet processing functionality of NR 206 for 5G cellular communication. Such functionality can be integrated, e.g., in a single housing, with the functionality of BBU 110 and/or DU 210. In other words, white box 306 can receive analog radio signal 304 and output encapsulated packets formatted according to ROE protocol 308 that can be used in connection with 5G implementation or Ethernet protocol 310 that can be used in connection with LTE or legacy implementations. It is envisioned that white box 306 can communicate with TRP 302 via optical links. White box 306 can be mounted on a tower of access point site 301, pole mounted, or situated at the base of access point site 301. In some embodiments, white box 306 can be non-rectangular in shape, such as oval-shaped. Such can simplify mounting to a pole or the access point site 301. In some embodiments, can be assembled from portions that clip together to facilitate simplified mounting.

White box 306 can support input from multiple TRPs 302, either serving the same sector or serving different sectors, and can thus process all traffic of access point site 301 for all frequencies or spectrum supported by access point site 301. In some embodiments, white box 306 can include TRP 302 functionality, such as by plugging TRP 302 into an interface of white box 306, which is further detailed in connection with FIG. 4. White box 306 can classify analog radio signal 304 according to the standard being used (e.g., 5G, LTE, 3G, etc.), and encapsulate the converted digital signal accordingly. For instance, an analog radio signal 304 that is 5G can be encapsulated as ROE protocol 308, or otherwise encapsulated as Ethernet protocol 310. In some embodiments, such classification can be accomplished based on the frequency of analog radio signal 304. In other embodiments, such can on other information such as device ID or a vendor code. For instance, receiving analog radio signal 304 from TRP 302 configured to support 5G can used to make the selection of ROE protocol 308. As another example, a destination for the encapsulated packet can be employed to make the encapsulation selection, which is further detailed in connection with FIG. 4.

Figure 4:
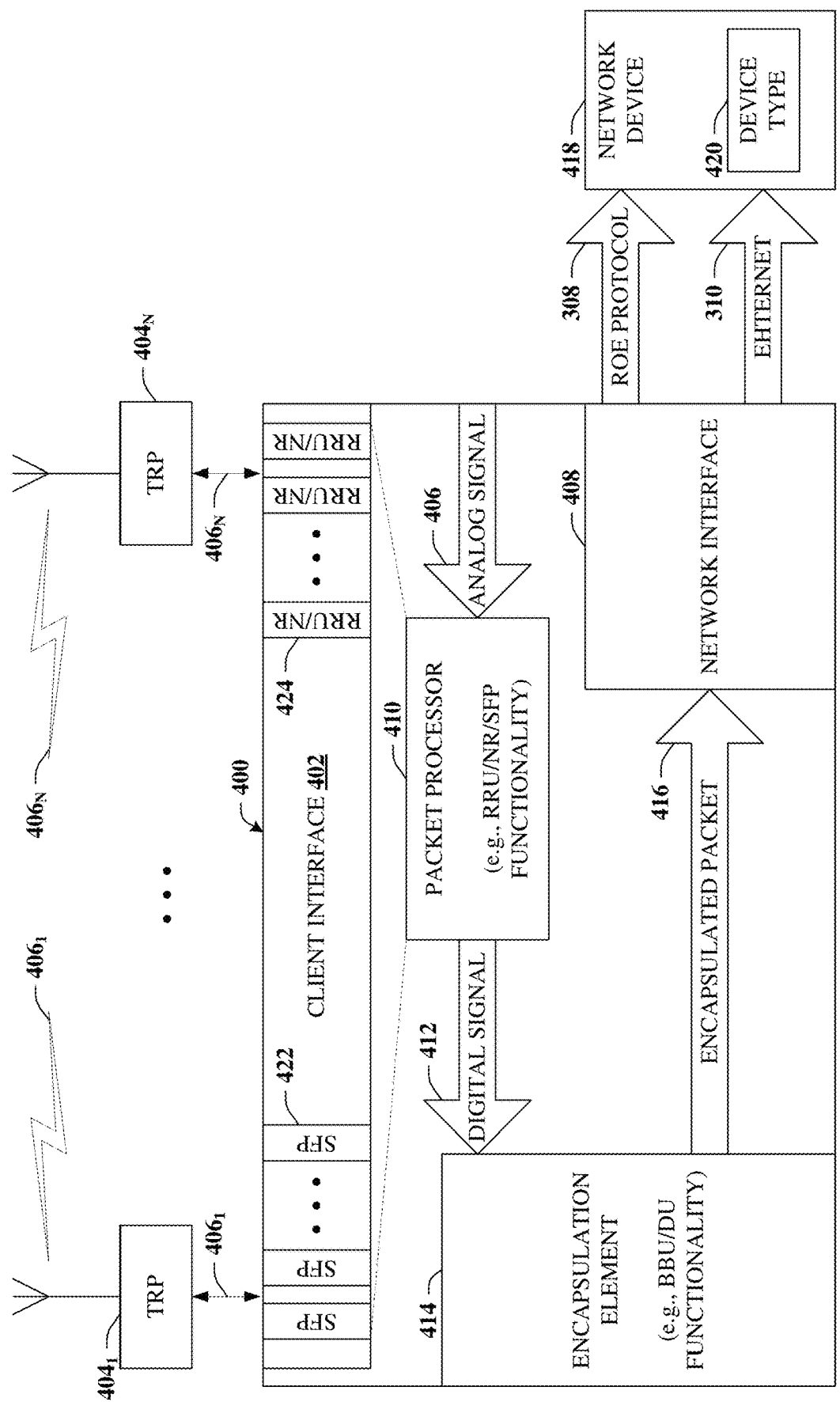
FIG. 4 depicted is a block diagram of an example white box that can integrate the functionality of multiple RRU and the functionality of all or portions of multiple BBU, receiving analog signals from multiple TRP and transforming those analog signals to digital signals encapsulated according to a specified protocol in accordance with certain embodiments of this disclosure.
Figure 6:
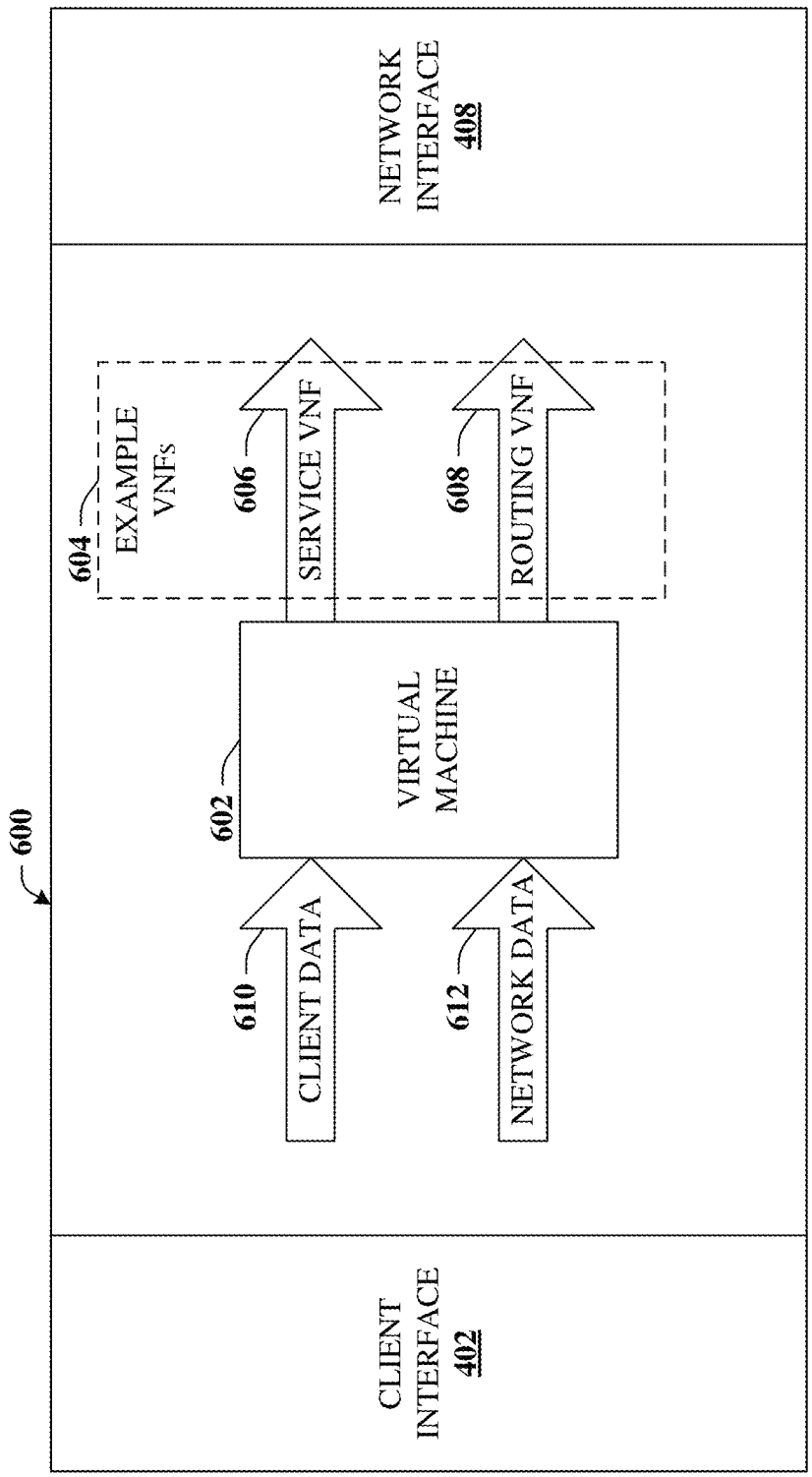
FIG. 6 depicts a block diagram of an example white box that can be configured to execute or instantiate a VNF in accordance with certain embodiments of this disclosure.

As will be detailed subsequently, FIG. 4 illustrates an example embodiment in which RRU/NR functionality and BBU/DU functionality are incorporated into the white box. FIG. 6 and others illustrate example embodiments in which the white box further incorporates functionality of the CU. By integrating functionality of multiple devices into a single device (e.g., white box 306), several advantages can be provided, many of which are now noted, and will be better understood with reference to the remainder of this specification.

For example, integrating these capabilities can simplify or perform more efficiently numerous service procedures such as a carrier aggregation, handover, beam forming, multiple-in-multiple-out (MIMO), load balancing, oversubscription, and so forth. Such can be simpler or more efficient because, e.g., it is no longer necessary for individual devices of other implementations to communicate with other devices before performing the procedure, but rather can act on information that is known and/or monitored at the white box.

To give an example, consider a handover procedure. In conventional architectures, a serving BBU (e.g., BBU 110 serving sector 1) typically needs to communicate with neighbor BBU (e.g., for a different sector or a different cell) in order to gather information (e.g., corresponding RRU resource availability) before effectuating the handover from the serving devices to the neighboring devices. In contrast, white box 306 can closely monitor information such as RRU capacity/utilization for both the serving sector devices and the neighboring sector devices and can readily determine suitable intra- or inter-sector handovers.

Other advantages of integrated functionality can relate to ease of software or firmware upgrades and other maintenance procedures, while still supporting all or a portion of 5G and legacy capabilities and services. For example, software for the RRU can be downloaded on an as-needed basis. In embodiments, that integrate functionality of the CU, white box 306 can further include software defined network (SDN) and network functions virtualization (NFV) capabilities, including instantiating a virtual network function (VNF). Such can remain compliant with 5G disaggregation of the BBU and can support cloud connectivity as well as lead to substantial cost savings and/or performance increases in connection with cloud infrastructure and satisfying latency requirements proposed in 5G.

For instance, white box 306 can instantiate various virtual network functions (NFVs) that, in addition to performing carrier aggregation, load balancing, and other service procedures, can route packets based on, e.g., service type and latency requirements. Thus, with some quite minimal processing, white box 306 can facilitate increased utilization or availability of existing cloud infrastructure and/or reduce the need for new cloud infrastructure.

Other white box 306 functionality, potentially in connection with NFVs, can include security through encryption and compression/decompression. Such can provide both enhanced security as well as better throughput as the operations can be performed at white box 306.

The remainder of this disclosure discusses example structure and functions of white box 306 in more detail, and is organized into two primary sections. The first section provides more detail in connection with architectural or structural design and associated functionality. The second section provides more detail in connection with leveraging the described architecture to facilitate routing functionality.

Example Systems and Architecture

Referring again to the drawings, with reference now to FIG. 4, a block diagram of an example white box 400 is illustrated. White box 400 can integrate the functionality of multiple RRU and the functionality of all or portions of multiple BBU, receiving analog signals from multiple TRP and transforming those analog signals to digital signals encapsulated according to a specified protocol in accordance with certain embodiments of this disclosure. Generally, white box 400 can comprise a processor and a memory that stores executable instructions that, when executed by the processor, facilitate performance of operations. Examples of the memory and processor can be found with reference to FIG. 15. It is to be appreciated that the computer 1502 can represent a server device of a communications network or a user equipment device and can be used in connection with implementing one or more of the systems, devices, or components shown and described in connection with FIG. 4 and other figures disclosed herein.

In some embodiments, white box 400 can be one example of white box 306. White box 400 can comprise client interface 402. Client interface 402 can be configured to interface to multiple transceiver devices of an access point site (e.g., access point site 301). An example of the multiple transceiver devices is illustrated here as TRP $404_1$-$404_N$, where N can be any suitable positive integer. It should be understood that the at least one TRP $404_1$-$404_N$ can be referred to herein, either collectively or individually as TRP 404, with appropriate subscripts employed generally only when useful or convenient to highlight various distinctions or to better impart the disclosed concepts. As used herein, "TRP" is intended to encompass capabilities and/or nomenclature for both 5G and previous standards. Thus, TRP 404 can be representative of either or both RRH 102 or TRP 202.

For example, client interface 402 can be configured to receive a first analog signal $406_1$ from TRP $404_1$, and a second analog signal $406_N$ from TRP $404_N$. White box 400 can include packet processing capabilities that is the same or similar to those of an RRU (e.g., RRU 106) or an NR (e.g., NR 206), or another suitable device (e.g., a small form factor pluggable (SFP)). Such functionality is illustrated by packet processor 410, which receives analog signal 406 and transforms or converts analog signal 406 to digital signal 412. In some embodiments, TRP $404_1$ and TRP $404_N$ can serve different sectors of the access point site, while in other embodiments TRP $404_1$ and TRP $404_N$ can serve the same sector of the access point site, communicating according to the same or a different spectrum. Such is illustrative of the concept that white box 400 can receive and process signals from multiple TRP, whereas conventional systems tend to rely on a one-to-one relationship between TRP-RRU-BBU, etc., and further tend to be sector-specific.

In some embodiments, packet processor 410 can represent an abstraction for multiple SFP devices 422 or RRU/NR devices 424. SFP devices 422 or RRU/NR devices 424 can be connected to or plugged into client interface device. Devices 422, 424 can be individually configured to support a particular sector and/or one or more frequency or spectrum ranges. In the aggregate, packet processor 410 can represent capabilities of handling analog signals 406 from all or a portion of the sectors of an access point site and all or a portion of the frequencies supported by that access point site. In some embodiments, TRP 404 can be plugged into client interface 402 in a manner similar to SFP devices 422 and/or RRU/NR devices 424.

As one example, if a UE is communicating according to 5G, then digital signal 412 can be formatted according to eCPRI, ROE, or another suitable format. As another example, if the UE is communicating according to a previous standard (e.g., LTE), then digital signal 412 can be formatted according to CPRI or another suitable format.

White box 406 can further include BBU functionality, which is illustrated as encapsulation element 414. 5G proposes the disaggregation of BBU functionality into DU functionality and CU functionality according to functional splits 1-8. Thus, as used herein, BBU functionality is intended to refer to the functionality of a BBU of LTE or previous standards (e.g., BBU 110) as well as the functionality of the DU (e.g., DU 210) and/or CU of 5G. Encapsulation element 114 can encapsulate packets of digital signal 412, resulting in encapsulated packet 416. Encapsulated packet 416 can be encapsulated according to a given protocol, which can be ROE protocol 308 (e.g., for 5G traffic) or Ethernet protocol 310 (e.g., for LTE or previous standard traffic). In some embodiments, the protocol selected can be based on a device type 420 of network device 418, representing a direct or indirect target for encapsulated packet 416.

Generally, encapsulation component operates to encapsulate a CPRI signal according to an Ethernet protocol 310 or to encapsulate an eCPRI signal according to an ROE protocol 310. In cases where equipment of packet processor 410 is configured to generate digital signal 412 according to ROE, encapsulation element 414 can forward all or a portion of digital signal 412 as encapsulated packet(s) 416, which can already be formatted according to ROE protocol 308.

Network interface 408 can be configured to transmit encapsulated packet 416 to network device 418. As noted, digital signal 412 can be encapsulated according to a given protocol (e.g., ROE or Ethernet) based on implementation, and white box 400 can be configured to support a variety of different implementations, as further detailed in connection with FIG. 5.

Figure 5:
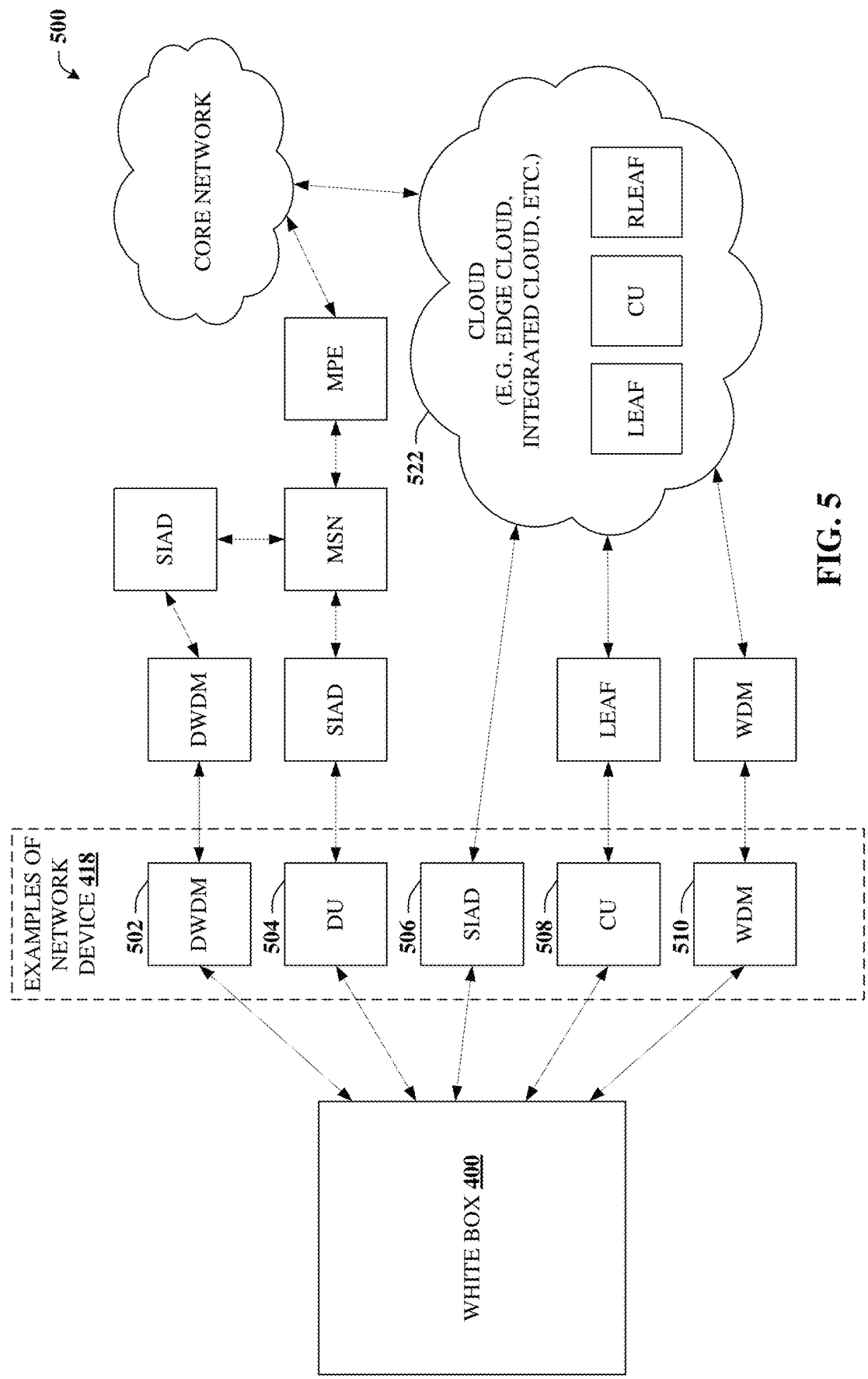
FIG. 5 depicts a block diagram illustrative of various example embodiments or implementations of the white box in accordance with certain embodiments of this disclosure.

Turning now to FIG. 5, a block diagram of system 500 is depicted. System 500 is illustrative of various example embodiments or implementations of the white box 400 in accordance with certain embodiments of this disclosure. For instance, based on a selected implementation of white box 400 and/or the type of traffic received by white box 400, traffic from white box 400 can be routed various different network devices 418, which can then be handled by other network elements in a manner that can be compliant with substantially any cellular standard.

For example, in a first embodiment, network device 418 can be dense wavelength division multiplexing (DWDM) device 502. In some embodiments, DWDM device 502 can communicate via dark fiber to a second DWDM device that can be connected to a SIAD to reach a multiservice node (MSN) and/or the core network. In the first embodiment, white box 400 can incorporate functionality multiple RRU functionality and multiple DU functionality.

In a second embodiment, white box 400 can be configured to incorporate multiple RRU functionality and DU functionality can be external. Network device 418 can thus be DU 504, which can communicate with a SIAD to the MSN and/or core network. According to a third embodiment, network device 418 can be SIAD 506. SIAD 506 can communicate with cloud 522, which, depending on implementation, can be one or more of an edge cloud (e.g., multi-access edge computing (MEC)) platform or an integrated cloud (IC) platform. In the third embodiments, white box 400 can integrate the functionality of multiple RRU and multiple DU.

In a fourth embodiment, white box 400 can be configured to incorporate functionality of multiple RRU and multiple DU, and network device 418 can be CU 508. CU 508 can communicate with a leaf element, which can be communicatively coupled to cloud 522. In a fifth embodiment, network device 418 can be wavelength division multiplexing (WDM) device 510. WDM device 510 can communicate with other WDM devices, potentially via dark fiber, and connect to cloud 522. In the fifth embodiment, white box 400 can be configured to incorporate the capabilities of multiple RRU, multiple DU, and one or more CU. In some embodiments, white box 400 can further incorporate the functionality of a SIAD.

It is appreciated that a given access point site can have a fiber link to any suitable target network device 48. In some embodiments, link aggregation (LAG) can be supported between white box 400 and a given network device 418. It is further appreciated that multi-chassis LAG can be supported for these links and redundancy can be established as well.

Referring now to FIG. 6, a block diagram of white box 600 is depicted. White box 600 can be configured to execute or instantiate a VNF in accordance with certain embodiments of this disclosure. Such can be illustrative of cloud capabilities integrated into white box 600 and/or CU capabilities. For example, white box 600 can instantiate virtual machine 602 that can be configured to execute one or more VNF 604. VNF 604 can be based on SDN protocols and/or NFV protocols. VNFs 604 can process packets of digital signal 412 and/or encapsulated packet(s) 416 based on any suitable data, which is herein referred to as client data 610 or network data 612. Examples of client data 610 can relate to equipment or services allocated or assigned to a given subscriber or UE, subscriber preferences or history, and so forth. Examples of network data 612 can relate to one or more of a resource utilization metric, a QoS or QoS classification identifier (QCI) indicator, an access control list (ACL), and so forth. Consistent with the organization of this disclosure, example VNFs 604 are described within the context of service VNFs 606, examples of which can be found at FIG. 7, and routing VNFs 608, which are further detailed in connection with FIGS. 8-10.

Figure 7:
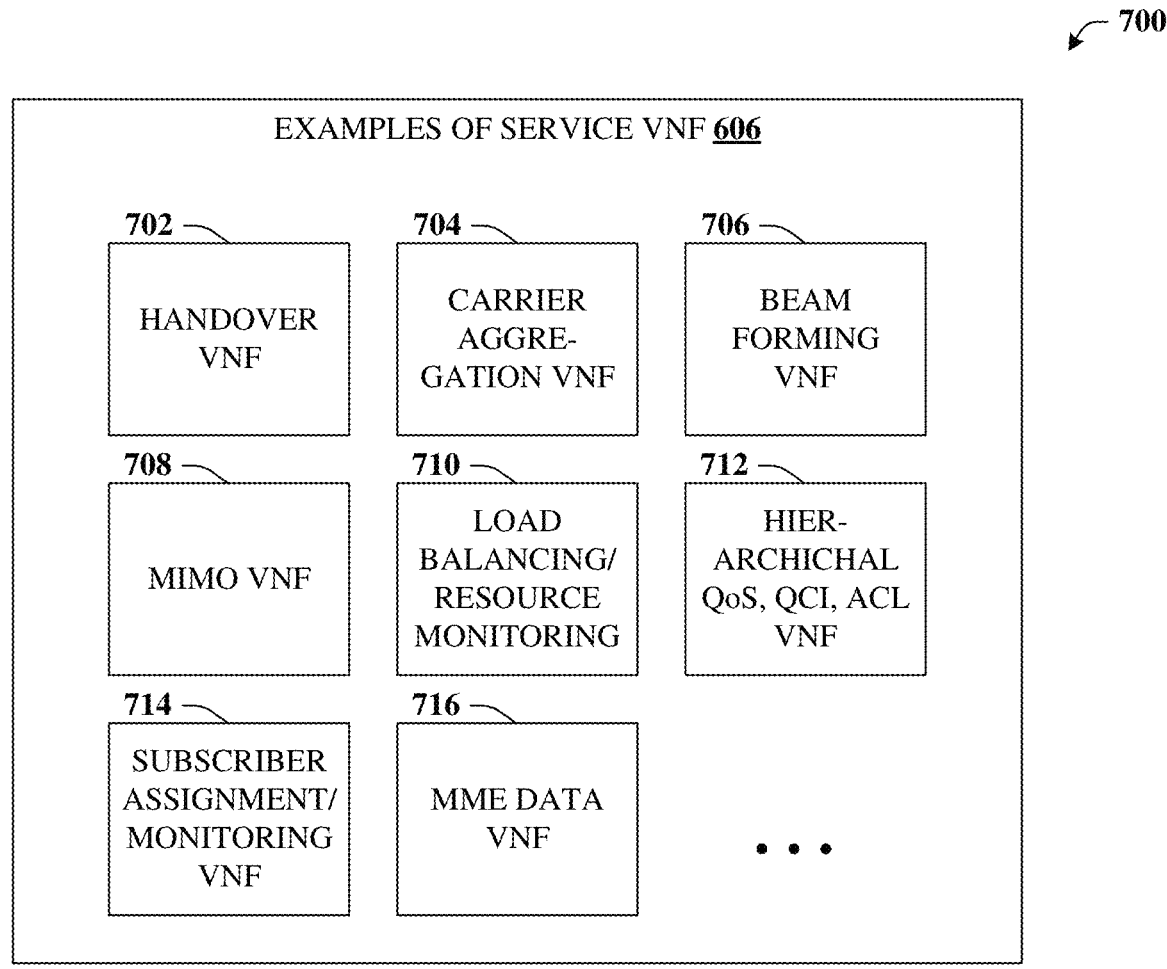
FIG. 7 is a block diagram illustrating various non-limiting examples of a service VNF in accordance with certain embodiments of this disclosure.

While still referring to FIG. 6, but turning now as well to FIG. 7, a block diagram 700 is depicted. Diagram 700 illustrates various non-limiting examples of a service VNF 606 in accordance with certain embodiments of this disclosure.

For example, virtual machine 602 can be configured to instantiate handover VNF 702. Handover VNF 702 can be configured to hand service of a UE from a serving transceiver device (e.g., TRP $404_1$) to a neighbor transceiver device (e.g., TRP $404_N$) in response to client data 610 received from the UE and/or network data 612 of devices of an associated access point site. As explained previously, due in part to the integrated functionality of white box 600, handovers can be more efficiently managed. For instance, since network data 612 can include real time or near real time information on the current state of one or both the serving devices and the neighbor devices, including current capacity and utilization of a particular RRU or other device. Hence, the handover can be assigned to an RRU determined to be best able to service the demands of the UE being handed over.

As another example, virtual machine 602 can be configured to instantiate carrier aggregation (CA) VNF 704. CA VNF 704 can be configured to aggregate spectrum used to communicate between a UE and a TRP of the access point site. Such can be based on a service allocation assigned to a subscriber associated with the UE (e.g., client data 610) as well as based on network data 612 such as resource availability. In a similar manner, virtual machine 602 can instantiate beam forming VNF 706 and/or MIMO VNF 708 that can perform corresponding functionality.

Additionally, virtual machine 602 can instantiate one or more load balancing VNFs or resource monitoring VNFs, which is collective depicted as VNF 710. Due in part to the integration of multiple elements detailed herein, white box 600 has the capability to perform interesting functions with respect to load balancing and resource monitoring. As one example, load balancing can be performed more efficiently within a given cell. For instance, resource monitoring can be fully integrated and on-site, which can be extremely efficient relative to other systems. Thus, load balancing, such as distributing the load for the access point site among the available RRU (and other) resources and within other constraints can be a much simplified task. As another example, since white box 600 can support multiple sectors of the access point site, and the same can be extended to neighbor access point sites, load balancing between cell sites can also be more efficient, as monitoring RRU resource utilization, new subscriber requirements, and other suitable data can be greatly simplified.

With regard to CA VNF 704, it is understood that multiple RRU can be configured to support the same spectrum in the same sector. These multiple RRU can be in sync with an associated TRP in the same sector, but have a different transmission time interval (TTI) to increase bandwidth that can be leveraged for CA application. Multiple TRPs can be in sync (e.g., via TTI) to support a single customer in connection with, e.g., CA. Since the TRP/RRU can be plugged into the white box supporting all or a portion of accessible frequencies or bands, such can allow numerous advantages. For example, such can allow reduce deployment costs since it is not required to obtain permission to mount RRU, but rather, RRU can be deployed and the white box can plug them in as needed and configure any suitable frequency or band. As another example advantage, no static allocation in terms of the number of sectors is required. Rather, as many or as few sectors can be allocated based on, e.g., line of sight of customers. Furthermore, the bandwidth per sector can be increased significantly since there is no inherent capacity per radio limit. In some embodiments, the TTI can be dynamic to support the bandwidth and other requirements. Regarding beam forming VNF 706, some of the multiple RRU-TRP elements can be directed to focus a beam (or direct antenna gain) toward a particular UE being served to effectuate efficient beam forming VNF 706.

Techniques similar to the above can be used in connection with hierarchical QoS VNF 712 and subscriber assignment VNF 714. As more subscribers are served by a particular access point site, each subscriber can be assigned to an RRU with the least load, for example. Such can be used in connection with subscriber assignment VNF 714, mobility management entity (MME) data VNF 716, and/or load balancing VNF 710. Such can also be compliant with existing and future standards in that the subscriber's initial spectrum and bandwidth assignment can be received from an MME in the core network, but more specific, access point site allocation can be managed based on usage and resource availability. In some embodiments, MME data 716 can periodically exchange information with the MME to these or other ends.

Regarding hierarchical QoS VNF 712, consider a subscriber that has subscribed to multiple services and has been allocated one GHz in bandwidth for the multiple services. QoS VNF 712 can ensure that the committed information rate (CIR) is met, and also monitor the actual information rate to be within suitable thresholds at or above the CIR. In some embodiments, a double hierarchical QoS can be employed, wherein a first QoS can be assigned on a per subscriber basis and a second QoS can be assigned on a per link basis.

In some embodiments, QoS VNF 712 or other VNFs or elements of white box 600 can provide dynamic utilization of resources between uplink traffic and downlink traffic. For example, suppose a particular subscriber is allocated 10 GHz for uplink traffic and 10 GHz for downlink traffic, for a total of 20 GHz. Suppose further it is identified that only 1 GHz is being used for uplink traffic, then the remaining 19 GHz (as opposed to 10 GHz originally allocated) can be used for downlink traffic.

Due in part to the tightly integrated nature of white box 600 and the supporting VNFs, capacity per sector, capacity per subscriber, and the number of subscribers per sector can all be increased over other systems. Such can provide opportunities in connection with oversubscription, which can be advantageous in two distinct ways. In one example, oversubscription can be employed to over assign subscribers having aggregate CIR greater than the capabilities of the access point site to which they are assigned. White box 600 can further comprise buffers that can buffer traffic that is delay tolerant, which can be used to enhance oversubscription capabilities. For example, conventional oversubscription relies on the concept that it is statistically unlikely for all subscribers to be demanding associated CIR concurrently, thus, a given access point site does not need to be capable of handling the aggregate CIR of all subscribers, but rather only a portion of that aggregate CIR. White box 600 can improve on that due to the expansive and inexpensive monitoring that can be performed and more efficient utilization optimizations. In addition, white box 600 can further improve oversubscription potential by buffering traffic that can tolerate delays and sending that traffic at opportune times with respect to utilization and latency and/or QoS requirements.

Conceptually, oversubscription can be advantageous because such can reduce the amount (and cost) of network equipment implemented at an access point site, without affecting the subscriber's experiences or expectations. As explained above, a first advantage tied to the concept of oversubscription can be to oversubscribe customers per RRU, which white box 600 can accomplish in an improved manner, as explained. A second advantage tied to the concept of oversubscription can be observed in the context of cloud infrastructure, particularly in view of 5G latency requirements for various splits.

As noted, significant cloud infrastructure build-up is envisioned for providers that intend to support high indices splits. However, by buffering traffic that is delay tolerant and prioritizing other traffic, a type of oversubscription can be observed for cloud infrastructure requirements. Such oversubscription can be significant, particularly in view of the fact that allocation on all RRU/TRP can be leveraged. In that regard, existing cloud infrastructure can be oversubscribed such that less cloud infrastructure build-up may be required and/or higher indices splits can be provided at a lower cost or with superior QoS or other service capabilities. These and other concepts are further detailed in connection with FIGS. 8-10.

Example Routing Techniques

Figure 8:
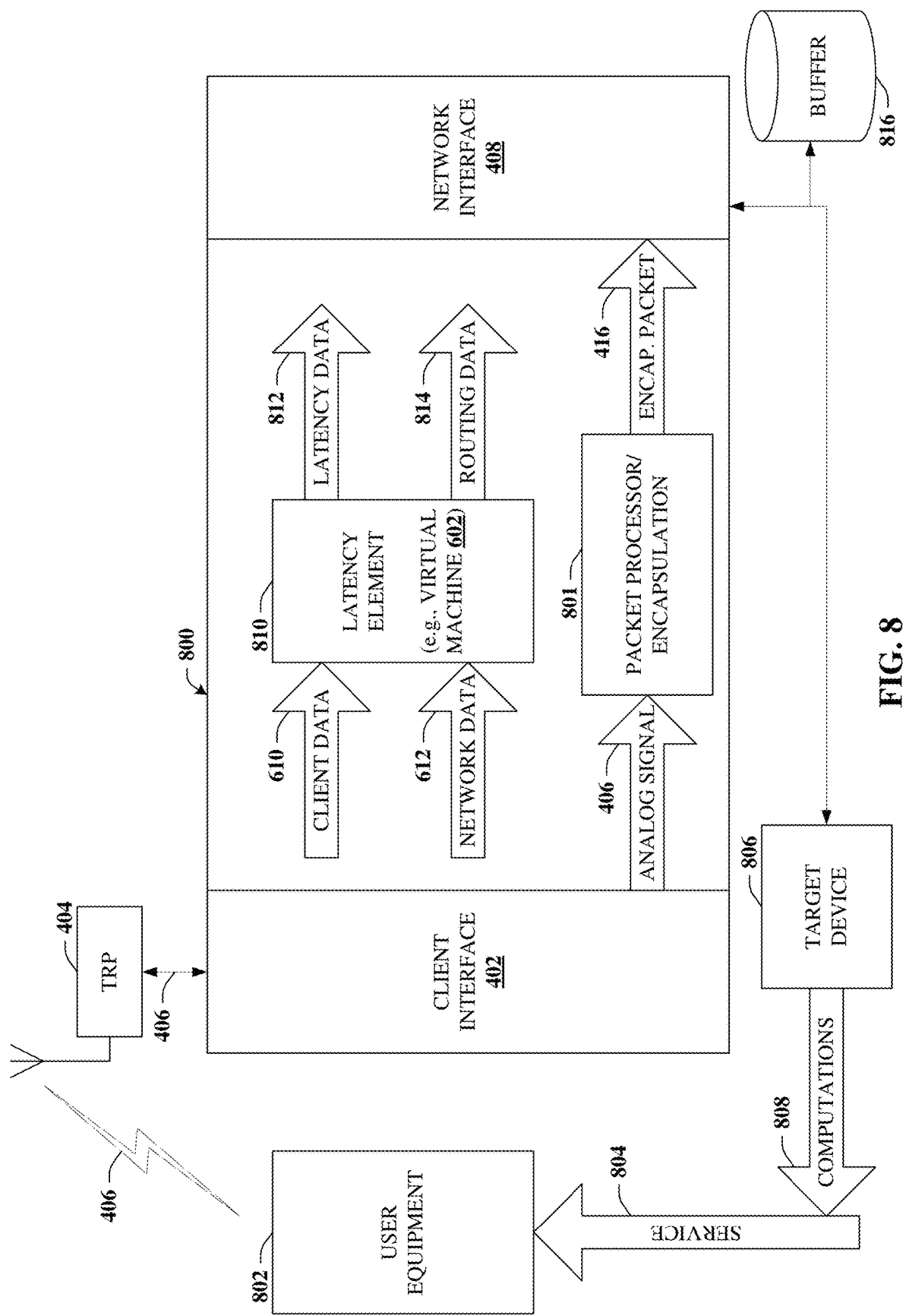
FIG. 8 depicts a block diagram of an example white box that can be configured to perform a lightweight determination to route network traffic based on latency requirements and other suitable factors in accordance with certain embodiments of this disclosure.

Referring now to FIG. 8, a block diagram of white box 800 is depicted. White box 800 can be configured to perform a lightweight determination to route network traffic based on latency requirements and other suitable factors in accordance with certain embodiments of this disclosure. White box 800 can include all or a portion of white box 400 and/or white box 600. For example, white box 800 can comprise client interface 402 that can be configured to receive analog signal 406 from user equipment 802. User equipment 802 can be substantially any subscriber device that is being provided service 804, e.g., by TRP 404 and/or an associated access point site (e.g., access point site 301). White box 800 can also include all or a portion of network interface 408 that can be configured to communicate with target device 806. Target device 806 can be configured to perform various computations 808 in connection with service 804.

White box 800 can include packet processor/encapsulation element 801 that can be configured to perform operations substantially similar to those described in connection with packet processor 410 and encapsulation element 414 of FIG. 4. For example, packet processor/encapsulation element 801 can transform analog signal 406 to a digital signal (e.g., digital signal 412), and can encapsulate packets of that digital signal, resulting in encapsulated packet 416. As detailed previously, encapsulated packet 416 can be formatted according to an ROE protocol or an Ethernet protocol.

White box 800 can further comprise latency element 810. Latency element 810 can be configured to generate latency data 812 and routing data 814. In some embodiments, such can be accomplished based on client data 610 and/or network data 612 as detailed in connection with virtual machine 602 of FIG. 6. Thus, in some embodiments, latency element 810 can represent suitable circuitry to perform the described operations, while in other embodiments, latency element 810 can be a virtual machine. In the latter case, latency data 812 and/or routing data 814 can be employed by or be generated by VNFs 604, such as routing VNF 608.

Generally, latency data 812 can be representative of an amount of latency tolerated by service 804. The amount of latency tolerated can be determination that can coincide with 5G latency requirements in terms of implementing one or more splits. In some embodiments, the amount of latency tolerated by service can be determined based on one or more indicators or metrics, which is further detailed in connection with FIG. 9.

Routing data 814 can comprise an identification of target device 806 that is determined to satisfy the amount of latency tolerated by service 814. The digital signal and/or encapsulated packet(s) 416 can be transmitted to target device 806 according to the routing data 814. In other words, target device 806 can be selected based on capabilities of providing computations 808 within the allotted amount of latency tolerated, hence, encapsulated packet(s) 416 can be routed accordingly. Various non-limiting examples are further detailed in connection with FIGS. 9 and 10, which are intended to be viewed alongside FIG. 8 for a more thorough understanding.

Figure 9:
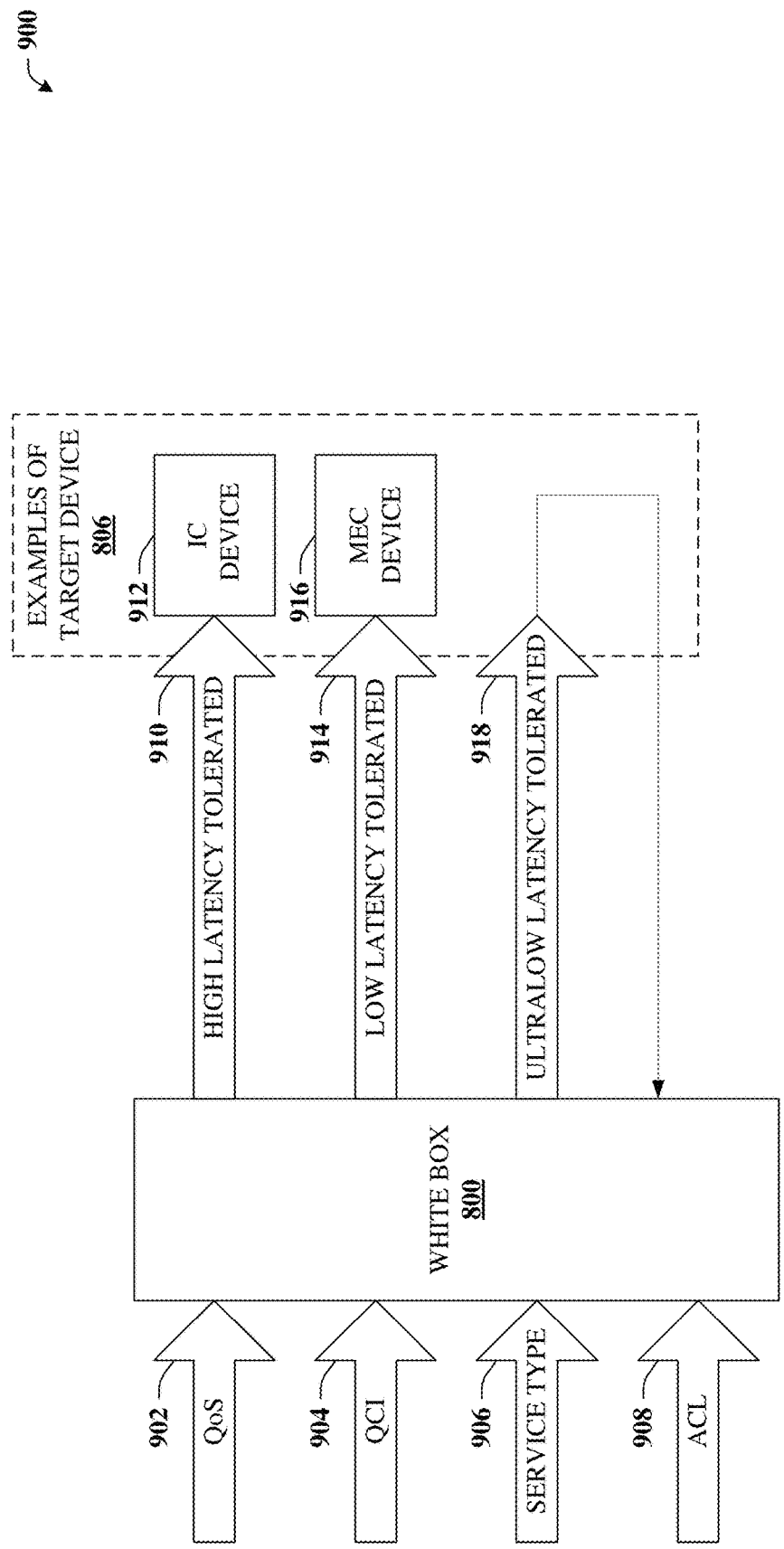
FIG. 9 illustrates a block diagram of an example system that can include the white box illustrating additional aspects or elements in connection with routing determinations in accordance with certain embodiments of this disclosure.

Referring now to FIG. 9, a block diagram of system 900 is depicted. System 900 can include white box 800 illustrating additional aspects or elements in connection with routing determinations in accordance with certain embodiments of this disclosure.

As noted, latency element 810 of white box 800 can determine latency data 812. In some embodiments, latency data 812 can be determined based on one or more of the following: a QoS indicator 902, a QCI indicator 904, or a service type indicator 906 (e.g., associated with a type of service 804). In some embodiments, an ACL indicator 908 can be employed, e.g., to establish permissions, establish a type of service preferred by the subscriber, or other suitable functions. Based on latency data 812, latency element 810 can determine a suitable target device and routing thereto, resulting in routing data 814.

For example, if the amount of latency tolerated is high (e.g., greater than a one or more high thresholds), as illustrated by reference numeral 910, a cloud device of an IC platform can be selected as target device 806, indicated by IC device 912. Typically, an IC platform represents significant computational power and, due in part to high implementations costs, IC platforms are likely to be less numerous. As one result, IC platforms are more likely to be more remote geographically or topologically to a vast majority of access point sites of a cellular network.

However, it is observed that by performing a small amount of processing at the access point site (e.g., by white box 800), IC platform devices can be targeted to perform computations 808. It is appreciated that such can occur even in cases where the split constraints specified by 5G would otherwise require computations to be performed closer to the access point device. Thus, the disclosed subject matter can, in a sense, provide oversubscription in terms of cloud infrastructure, e.g., by routing all or a portion of traffic to IC device(s) 912, provided latency data 812 indicates the delay can be tolerated. Such effectively reduces resource utilization of resources that are geographically or topologically closer to the access point site such that those resources can be devoted, substantially exclusively, to tasks with lower latency demands. Additionally, or alternatively, if the amount of latency tolerated is high, encapsulated packet(s) 416 can be temporarily stored to buffer 816. Such can further oversubscription ends in that delay tolerant traffic can be stored to buffer by higher priority traffic and/or delay intolerant traffic is processed.

If the amount of latency tolerated is not high (e.g., less than the one or more high thresholds), as illustrated by reference numeral 914, a MEC device 916 of a MEC platform can be selected as target device 806. In some embodiments, a virtual LAN (VLAN) tag can be applied for edge routing. In some embodiments, a VXLAN tag can be provided, e.g., to support layer 3 (L3) routing. Typically, a MEC platform exists at a network edge and is therefore more likely to be geographically or topologically closer to access point sites, such as access point site 301. MEC platforms can be more numerous than IC platforms, so it can be desirable to limit the costs of implementation and maintenance of MEC platforms. Thus, by offloading delay tolerant traffic to an IC platform, the load on MEC platforms can be reduced and/or focused on traffic that cannot be handled by an IC platform.

It is observed that white box 800 can be equipped with virtual machine 802, and thus can provide cloud-based services at the access point site. While computing power of this virtual environment may be less than MEC and IC platforms, white box 800 can be configured to provide computations 808, albeit on a more limited basis. Thus, if the amount of latency tolerated is extremely low (e.g., less than the one or more low thresholds), as illustrated by reference numeral 918, a white box 800 can be selected as target device 806.

Figure 10:
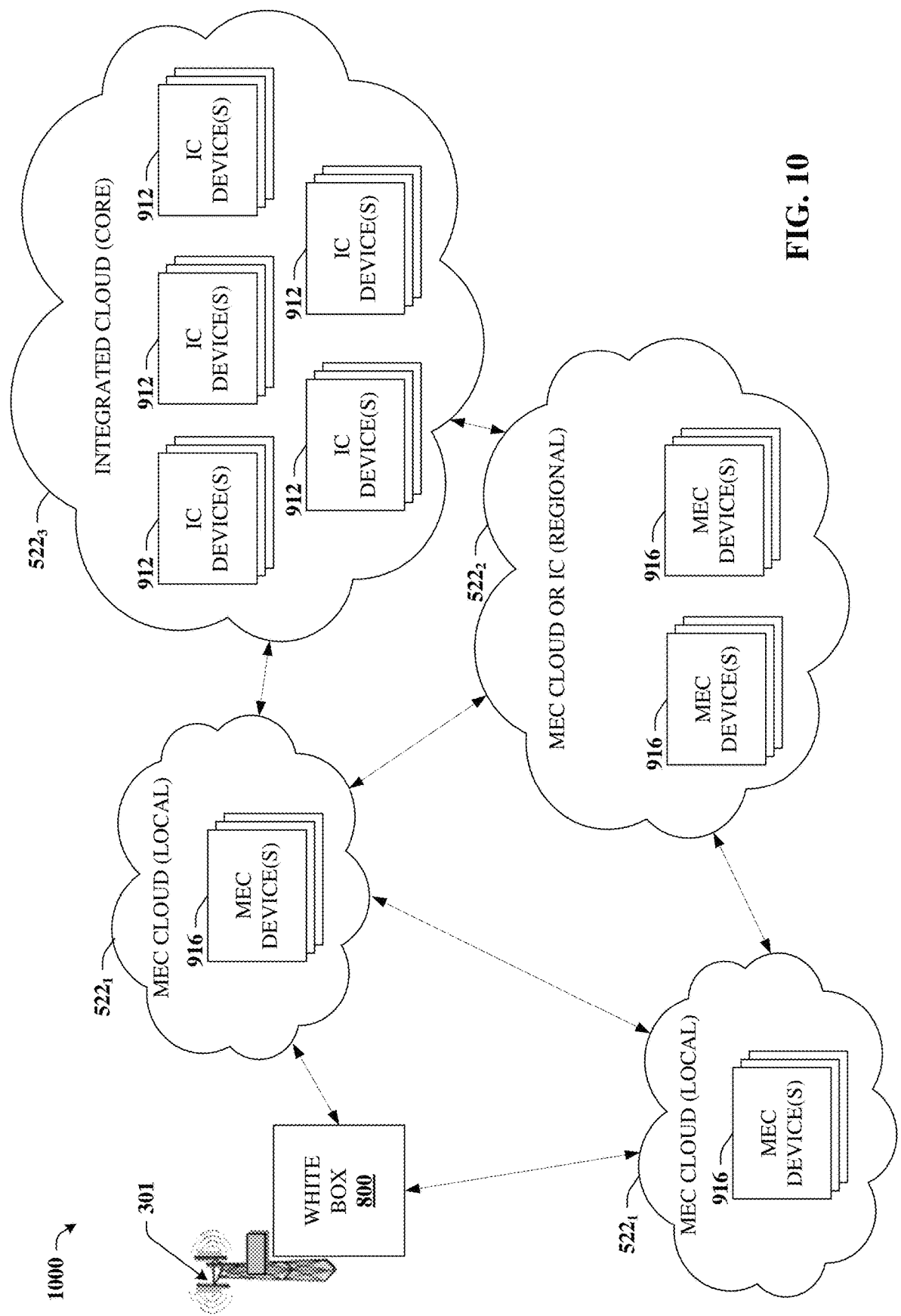
FIG. 10 illustrates a block diagram illustrating example benefits of the white box in connection with cloud infrastructure in accordance with certain embodiments of this disclosure.

Referring now to FIG. 10, a block diagram of system 1000 is depicted. System 1000 illustrates example benefits of the white box in connection with cloud infrastructure in accordance with certain embodiments of this disclosure. For instance, various MEC clouds $522_1$ can reside at a network edge and can represent cloud infrastructure that is more local to access point sites. MEC cloud $522_2$ can represent a regional cloud that can manage or serve local MEC clouds $522_1$.

In some embodiments, MEC clouds $522_1$ can be more numerous but associated costs can be offset by having fewer MEC devices 916 than is likely to exist in regional cloud $522_2$. Integrated cloud $522_3$ can represent one or more IC platforms, and can have a large number of IC devices 912.

5G proposes that MEC clouds $522_1$ have processing power sufficient to handle substantially all the cloud-based computational needs of access point sites being served and to do so within the 5G latency requirements. However, as explained previously, white box 800 can utilize intelligent routing techniques as well as buffer 816 to provide buffering techniques to effectively allow client over subscription and oversubscription in terms of cloud infrastructure. As illustrated, cloud infrastructure can be arranged in hierarchical fashion to take advantage of the capabilities of white box 800.

For example, white box 800 can intelligently route packets that can tolerate longer delays to an IC platform 5223, which can free up resources that might otherwise be utilized at MEC clouds $522_1$ or $522_2$ and/or route packets that can tolerate intermediate delays to regional MEC cloud $522_2$ instead of local MEC cloud $522_1$. In other words, packets can be intelligently routed to increasingly remote nodes (e.g., in terms of topology or geography), which will likely have increasingly more resources (e.g., in terms of bandwidth or computation). Furthermore, extremely high priority or low latency packets can be processed at white box 800. Such can satisfy certain rigorous latency requirements, and can further free up additional resources at local MEC cloud $522_1$ or other more remote nodes.

Example Methods

Figure 11:
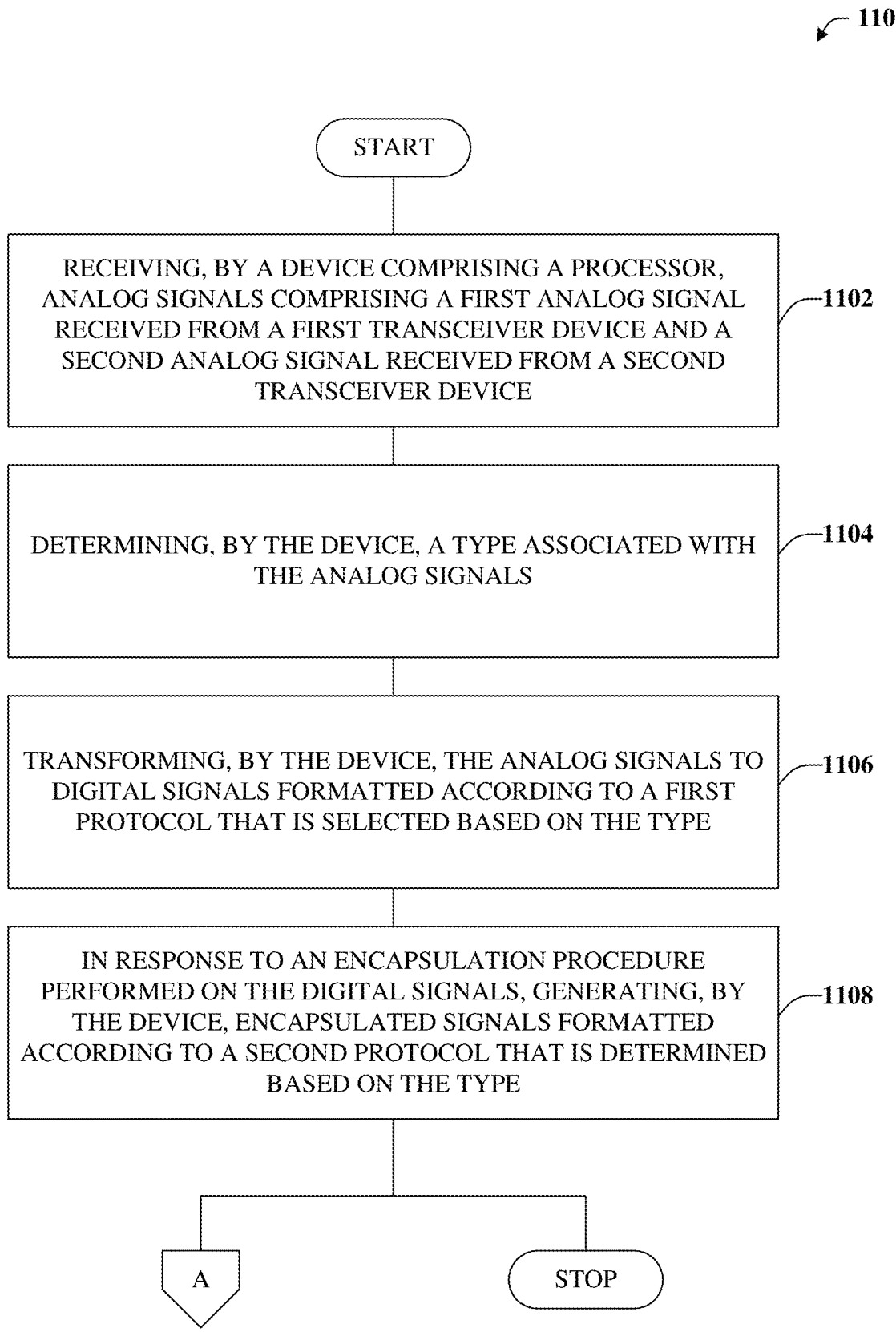
FIG. 11 illustrates an example methodology that can integrate the functionality of multiple RRU and the functionality of all or portions of multiple BBU in accordance with certain embodiments of this disclosure.
Figure 12:
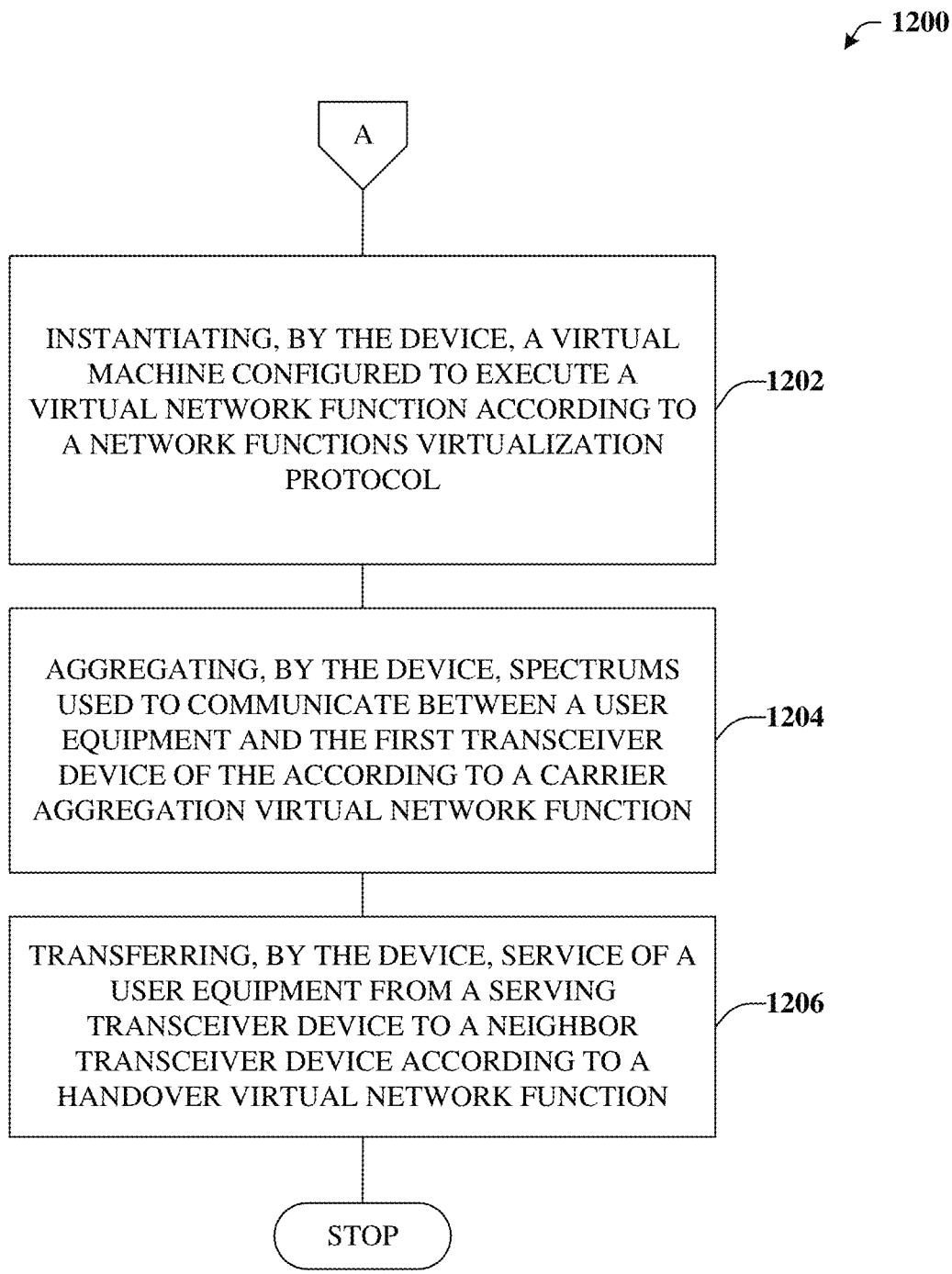
FIG. 12 illustrates an example methodology that can provide for additional elements or aspects in connection with integrating RRU and BBU functionality in accordance with certain embodiments of this disclosure.

FIGS. 11 and 12 illustrate various methodologies in accordance with the disclosed subject matter. While, for purposes of simplicity of explanation, the methodologies are shown and described as a series of acts, it is to be understood and appreciated that the disclosed subject matter is not limited by the order of acts, as some acts may occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the disclosed subject matter. Additionally, it should be further appreciated that the methodologies disclosed hereinafter and throughout this specification are capable of being stored on an article of manufacture to facilitate transporting and transferring such methodologies to computers.

Turning now to FIG. 11, exemplary method 1100 is depicted. Method 1100 can integrate the functionality of multiple RRU and the functionality of all or portions of multiple BBU in accordance with certain embodiments of this disclosure. For example, at reference numeral 1102, a device comprising a processor can receive analog signals. The analog signals can comprise a first analog signal received from a first transceiver device and a second analog signal received from a second transceiver device. Receiving analog signals from multiple transceiver devices can represent the integrated capabilities of multiple RRU. In some embodiments, the first transceiver device can serve a first sector of an associated access point site and the second transceiver device can serve a second sector of the access point site.

At reference numeral 1104, the device can determine a type associated with the analog signals. For example, the type can relate to a standard being used such as 5G or a previous standard or protocol. In some embodiments, the type can be determined based on a frequency or spectrum being used or can be determined based on a type of device from which the analog signal is received or a device type of a destination.

At reference numeral 1106, the device can transform the analog signals to digital signals. The digital signals can be formatted according to a first protocol that is selected based on the type. For example, if the type indicates 5G, then the first protocol can be eCPRI. If the type indicates a previous standard (e.g., LTE), then the first protocol can be CPRI.

At reference numeral 1108, the device can generate encapsulated signals. It is noted that eCPRI is a proprietary protocol, but such can be supported by adding an ROE or Ethernet header encapsulation to support routing through the network. The encapsulated signals can be generated in response to an encapsulation procedure performed on the digital signals. In some embodiments, the encapsulation procedure can be performed as part of an analog-to-digital conversion performed in connection with reference numeral 1106. For instance, some RRU-type vendor equipment can be configured to convert to an ROE format or an Ethernet format. Regardless, the encapsulated signal can be formatted according to a second protocol that is determined based on the type. For example, if the type indicates 5G, then the second protocol can be ROE. If the type indicates a previous standard (e.g., LTE), then the second protocol can be Ethernet. Method 1100 can proceed to insert A, which is further detailed in connection with FIG. 12, or stop.

With reference now to FIG. 12, exemplary method 1200 is illustrated. Method 1200 can provide for additional elements or aspects in connection with integrating RRU and BBU functionality in accordance with certain embodiments of this disclosure. For example, at reference numeral 1202, the device can instantiate a virtual machine configured to execute a VNF according to a network functions virtualization protocol.

At reference numeral 1204, the device can instantiate a carrier aggregation VNF, representative of an example type of VNF introduced at reference numeral 1202. The CA VNF can provide for aggregating spectrums used to communicate between a user equipment and the first transceiver device of the according to the carrier aggregation function.

At reference numeral 1206, the device can instantiate a handover VNF, representative of an example type of VNF introduced at reference numeral 1202. The handover VNF can provide for transferring service of a user equipment from a serving transceiver device (e.g., the first transceiver device) to a neighbor transceiver device (e.g., the second transceiver device) according to the handover function. In some embodiments, the neighbor transceiver device can be a transceiver device of a neighbor access point site.

Example Operating Environments

Figure 13:
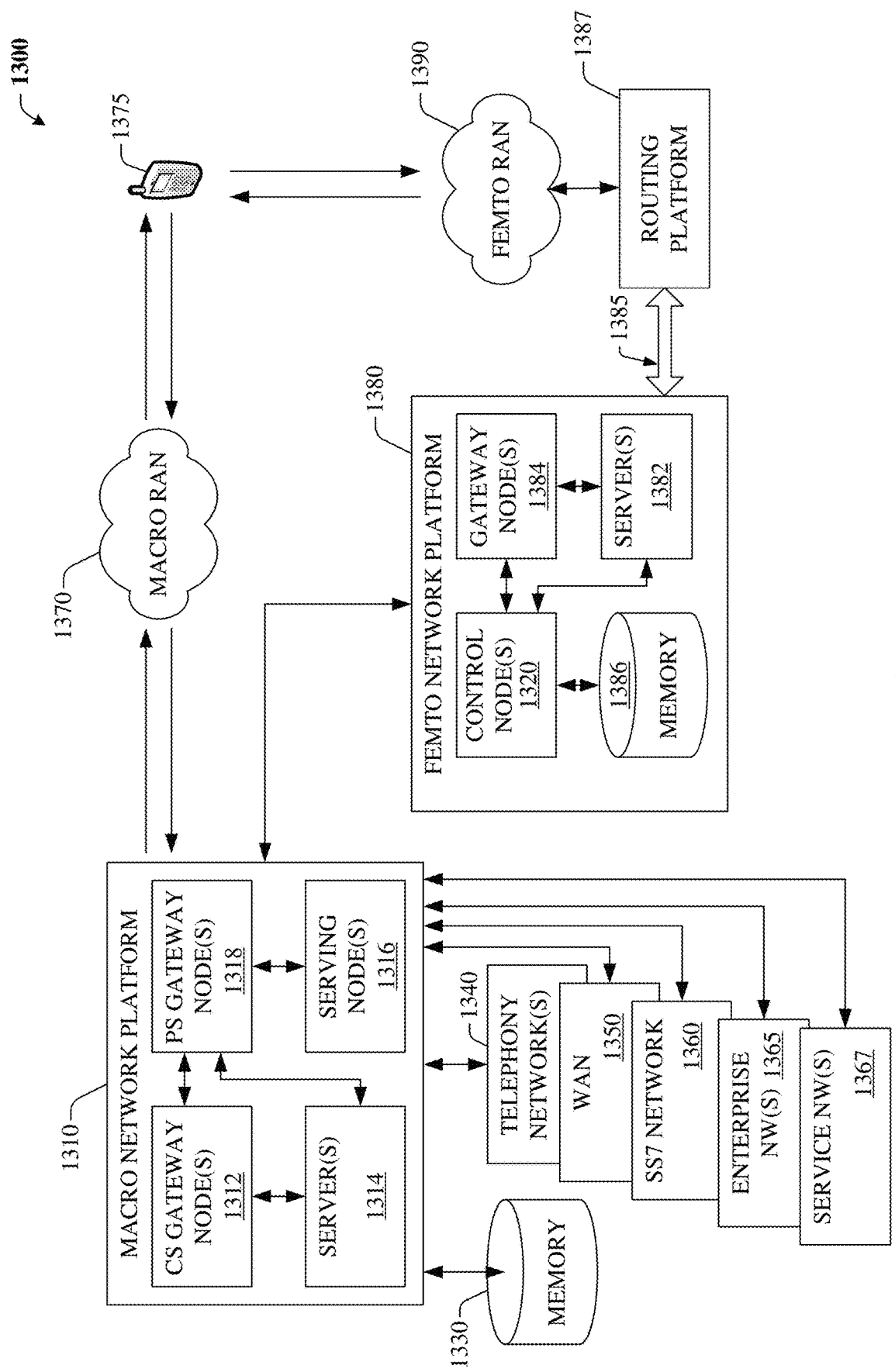
FIG. 13 illustrates a first example of a wireless communications environment with associated components that can be operable to execute certain embodiments of this disclosure.

To provide further context for various aspects of the subject specification, FIG. 13 illustrates an example wireless communication environment 1300, with associated components that can enable operation of a femtocell enterprise network in accordance with aspects described herein. Wireless communication environment 1300 comprises two wireless network platforms: (i) A macro network platform 1310 that serves, or facilitates communication with user equipment 1375 via a macro radio access network (RAN) 1370. It should be appreciated that in cellular wireless technologies (e.g., 4G, 3GPP UMTS, HSPA, 3GPP LTE, 3GPP UMB, 5G), macro network platform 1310 is embodied in a Core Network. (ii) A femto network platform 1380, which can provide communication with UE 1375 through a femto RAN 1390, linked to the femto network platform 1380 through a routing platform 1387 via backhaul pipe(s) 1385. It should be appreciated that femto network platform 1380 typically offloads UE 1375 from macro network, once UE 1375 attaches (e.g., through macro-to-femto handover, or via a scan of channel resources in idle mode) to femto RAN.

It is noted that RAN comprises base station(s), or access point(s), and its associated electronic circuitry and deployment site(s), in addition to a wireless radio link operated in accordance with the base station(s). Accordingly, macro RAN 1370 can comprise various coverage cells, while femto RAN 1390 can comprise multiple femto access points or multiple metro cell access points. As mentioned above, it is to be appreciated that deployment density in femto RAN 1390 can be substantially higher than in macro RAN 1370.

Generally, both macro and femto network platforms 1310 and 1380 comprise components, e.g., nodes, gateways, interfaces, servers, or platforms, that facilitate both packet-switched (PS) (e.g., internet protocol (IP), Ethernet, frame relay, asynchronous transfer mode (ATM)) and circuit-switched (CS) traffic (e.g., voice and data) and control generation for networked wireless communication. In an aspect of the subject innovation, macro network platform 1310 comprises CS gateway node(s) 1312 which can interface CS traffic received from legacy networks like telephony network(s) 1340 (e.g., public switched telephone network (PSTN), or public land mobile network (PLMN)) or a SS7 network 1360. Circuit switched gateway 1312 can authorize and authenticate traffic (e.g., voice) arising from such networks. Additionally, CS gateway 1312 can access mobility, or roaming, data generated through SS7 network 1360; for instance, mobility data stored in a VLR, which can reside in memory 1330. Moreover, CS gateway node(s) 1312 interfaces CS-based traffic and signaling and gateway node(s) 1318. As an example, in a 3GPP UMTS network, gateway node(s) 1318 can be embodied in gateway GPRS support node(s) (GGSN).

In addition to receiving and processing CS-switched traffic and signaling, gateway node(s) 1318 can authorize and authenticate PS-based data sessions with served (e.g., through macro RAN) wireless devices. Data sessions can comprise traffic exchange with networks external to the macro network platform 1310, like wide area network(s) (WANs) 1350; it should be appreciated that local area network(s) (LANs) can also be interfaced with macro network platform 1310 through gateway node(s) 1318. Gateway node(s) 1318 generates packet data contexts when a data session is established. To that end, in an aspect, gateway node(s) 1318 can comprise a tunnel interface (e.g., tunnel termination gateway (TTG) in 3GPP UMTS network(s); not shown) which can facilitate packetized communication with disparate wireless network(s), such as Wi-Fi networks. It should be further appreciated that the packetized communication can comprise multiple flows that can be generated through server(s) 1314. It is to be noted that in 3GPP UMTS network(s), gateway node(s) 1318 (e.g., GGSN) and tunnel interface (e.g., TTG) comprise a packet data gateway (PDG).

Macro network platform 1310 also comprises serving node(s) 1316 that convey the various packetized flows of information or data streams, received through gateway node(s) 1318. As an example, in a 3GPP UMTS network, serving node(s) can be embodied in serving GPRS support node(s) (SGSN).

As indicated above, server(s) 1314 in macro network platform 1310 can execute numerous applications (e.g., location services, online gaming, wireless banking, wireless device management . . . ) that generate multiple disparate packetized data streams or flows, and manage (e.g., schedule, queue, format . . . ) such flows. Such application(s), for example can comprise add-on features to standard services provided by macro network platform 1310. Data streams can be conveyed to gateway node(s) 1318 for authorization/authentication and initiation of a data session, and to serving node(s) 1316 for communication thereafter. Server(s) 1314 can also effect security (e.g., implement one or more firewalls) of macro network platform 1310 to ensure network's operation and data integrity in addition to authorization and authentication procedures that CS gateway node(s) 1312 and gateway node(s) 1318 can enact. Moreover, server(s) 1314 can provision services from external network(s), e.g., WAN 1350, or Global Positioning System (GPS) network(s) (not shown). It is to be noted that server(s) 1314 can comprise one or more processor configured to confer at least in part the functionality of macro network platform 1310. To that end, the one or more processor can execute code instructions stored in memory 1330, for example.

In example wireless environment 1300, memory 1330 stores information related to operation of macro network platform 1310. Information can comprise business data associated with subscribers; market plans and strategies, e.g., promotional campaigns, business partnerships; operational data for mobile devices served through macro network platform; service and privacy policies; end-user service logs for law enforcement; and so forth. Memory 1330 can also store information from at least one of telephony network(s) 1340, WAN(s) 1350, or SS7 network 1360, enterprise NW(s) 1365, or service NW(s) 1367.

Femto gateway node(s) 1384 have substantially the same functionality as PS gateway node(s) 1318. Additionally, femto gateway node(s) 1384 can also comprise substantially all functionality of serving node(s) 1316. In an aspect, femto gateway node(s) 1384 facilitates handover resolution, e.g., assessment and execution. Further, control node(s) 1320 can receive handover requests and relay them to a handover component (not shown) via gateway node(s) 1384. According to an aspect, control node(s) 1320 can support RNC capabilities.

Server(s) 1382 have substantially the same functionality as described in connection with server(s) 1314. In an aspect, server(s) 1382 can execute multiple application(s) that provide service (e.g., voice and data) to wireless devices served through femto RAN 1390. Server(s) 1382 can also provide security features to femto network platform. In addition, server(s) 1382 can manage (e.g., schedule, queue, format . . . ) substantially all packetized flows (e.g., IP-based) it generates in addition to data received from macro network platform 1310. It is to be noted that server(s) 1382 can comprise one or more processor configured to confer at least in part the functionality of macro network platform 1310. To that end, the one or more processor can execute code instructions stored in memory 1386, for example.

Memory 1386 can comprise information relevant to operation of the various components of femto network platform 1380. For example, operational information that can be stored in memory 1386 can comprise, but is not limited to, subscriber information; contracted services; maintenance and service records; femto cell configuration (e.g., devices served through femto RAN 1390, access control lists, or white lists); service policies and specifications; privacy policies; add-on features; and so forth.

It is noted that femto network platform 1380 and macro network platform 1310 can be functionally connected through one or more reference link(s) or reference interface(s). In addition, femto network platform 1380 can be functionally coupled directly (not illustrated) to one or more of external network(s) 1340, 1350, 1360, 1365 or 1367. Reference link(s) or interface(s) can functionally link at least one of gateway node(s) 1384 or server(s) 1386 to the one or more external networks 1340, 1350, 1360, 1365 or 1367.

Figure 14:
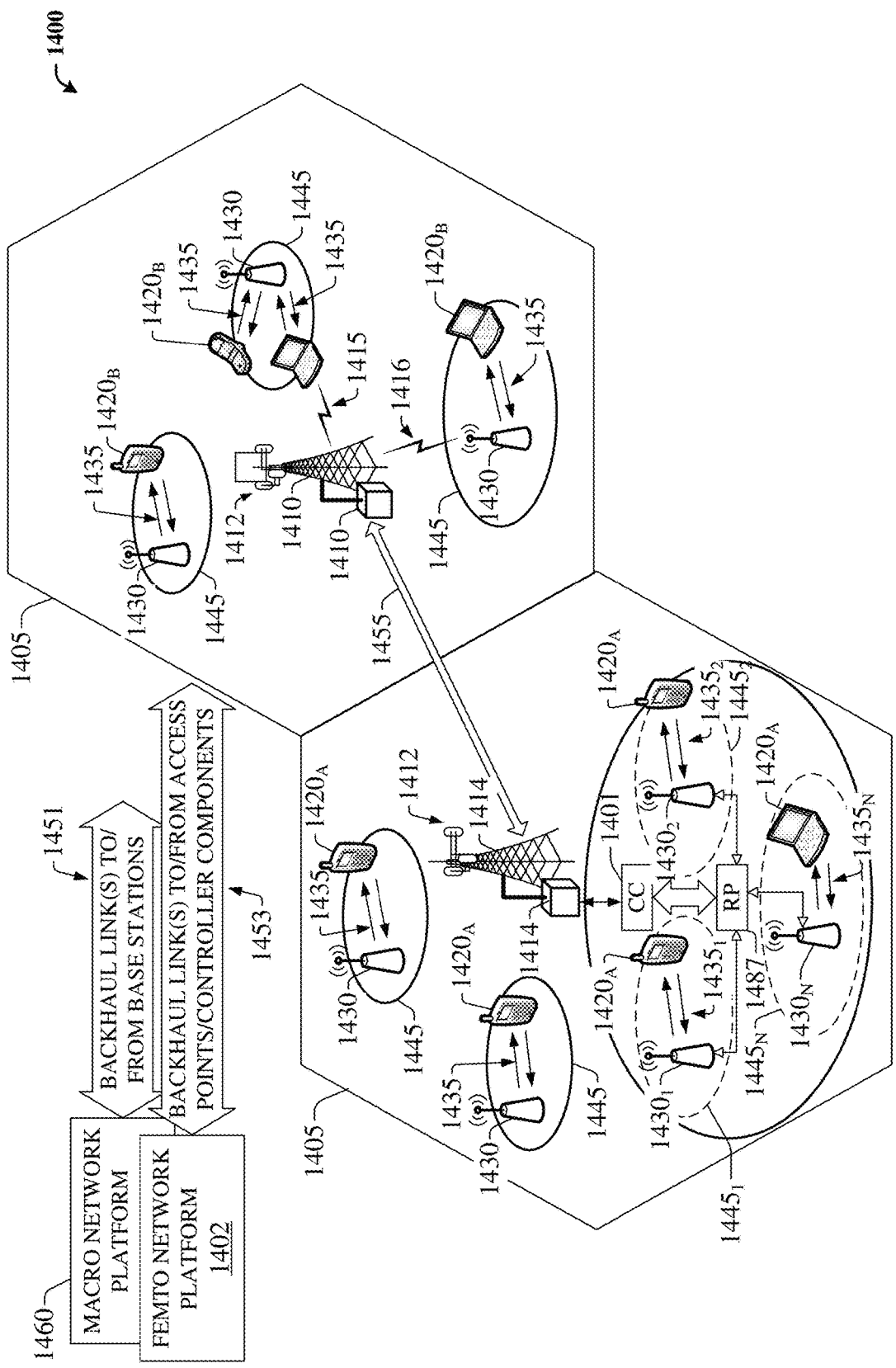
FIG. 14 illustrates a second example of a wireless communications environment with associated components that can be operable to execute certain embodiments of this disclosure.

FIG. 14 illustrates a wireless environment that comprises macro cells and femtocells for wireless coverage in accordance with aspects described herein. In wireless environment 1405, two areas represent "macro" cell coverage; each macro cell is served by a base station 1410. It can be appreciated that macro cell coverage area 1405 and base station 1410 can comprise functionality, as more fully described herein, for example, with regard to system 1400. Macro coverage is generally intended to serve mobile wireless devices, like UE $1420_A$, $1420_B$, in outdoors locations. An over-the-air (OTA) wireless link 1435 provides such coverage, the wireless link 1435 comprises a downlink (DL) and an uplink (UL), and utilizes a predetermined band, licensed or unlicensed, of the radio frequency (RF) spectrum. As an example, UE $1420_A$, $1420_B$ can be a 3GPP Universal Mobile Telecommunication System (UMTS) mobile phone. It is noted that a set of base stations, its associated electronics, circuitry or components, base stations control component(s), and wireless links operated in accordance to respective base stations in the set of base stations form a radio access network (RAN). In addition, base station 1410 communicates via backhaul link(s) 1451 with a macro network platform 1460, which in cellular wireless technologies (e.g., 3rd Generation Partnership Project (3GPP) Universal Mobile Telecommunication System (UMTS), Global System for Mobile Communication (GSM)) represents a core network.

In an aspect, macro network platform 1460 controls a set of base stations 1410 that serve either respective cells or a number of sectors within such cells. Base station 1410 comprises radio equipment 1414 for operation in one or more radio technologies, and a set of antennas 1412 (e.g., smart antennas, microwave antennas, satellite dish(es) . . . ) that can serve one or more sectors within a macro cell 1405. It is noted that a set of radio network control node(s), which can be a part of macro network platform 1460; a set of base stations (e.g., Node B 1410) that serve a set of macro cells 1405; electronics, circuitry or components associated with the base stations in the set of base stations; a set of respective OTA wireless links (e.g., links 1415 or 1416) operated in accordance to a radio technology through the base stations; and backhaul link(s) 1455 and 1451 form a macro radio access network (RAN). Macro network platform 1460 also communicates with other base stations (not shown) that serve other cells (not shown). Backhaul link(s) 1451 or 1453 can comprise a wired backbone link (e.g., optical fiber backbone, twisted-pair line, T1/E1 phone line, a digital subscriber line (DSL) either synchronous or asynchronous, an asymmetric ADSL, or a coaxial cable . . . ) or a wireless (e.g., line-of-sight (LOS) or non-LOS) backbone link. Backhaul pipe(s) 1455 link disparate base stations 1410. According to an aspect, backhaul link 1453 can connect multiple femto access points 1430 and/or controller components (CC) 1401 to the femto network platform 1402. In one example, multiple femto APs can be connected to a routing platform (RP) 1487, which in turn can be connect to a controller component (CC) 1401. Typically, the information from UEs $1420_A$ can be routed by the RP 1487, for example, internally, to another UE $1420_A$ connected to a disparate femto AP connected to the RP 1487, or, externally, to the femto network platform 1402 via the CC 1401, as discussed in detail supra.

In wireless environment 1405, within one or more macro cell(s) 1405, a set of femtocells 1445 served by respective femto access points (APs) 1430 can be deployed. It can be appreciated that, aspects of the subject innovation can be geared to femtocell deployments with substantive femto AP density, e.g., $14^4$-$10^7$ femto APs 1430 per base station 1410. According to an aspect, a set of femto access points $1430_1$-$1430_N$, with N a natural number, can be functionally connected to a routing platform 1487, which can be functionally coupled to a controller component 1401. The controller component 1401 can be operationally linked to the femto network platform 1402 by employing backhaul link(s) 1453. Accordingly, UE $1420_A$ connected to femto APs $1430_1$-$1430_N$ can communicate internally within the femto enterprise via the routing platform (RP) 1487 and/or can also communicate with the femto network platform 1402 via the RP 1487, controller component 1401 and the backhaul link(s) 1453. It can be appreciated that although only one femto enterprise is depicted in FIG. 14, multiple femto enterprise networks can be deployed within a macro cell 1405.

It is noted that while various aspects, features, or advantages described herein have been illustrated through femto access point(s) and associated femto coverage, such aspects and features also can be exploited for home access point(s) (HAPs) that provide wireless coverage through substantially any, or any, disparate telecommunication technologies, such as for example Wi-Fi (wireless fidelity) or picocell telecommunication. Additionally, aspects, features, or advantages of the subject innovation can be exploited in substantially any wireless telecommunication, or radio, technology; for example, Wi-Fi, Worldwide Interoperability for Microwave Access (WiMAX), Enhanced General Packet Radio Service (Enhanced GPRS), 3GPP LTE, 3GPP2 UMB, 3GPP UMTS, HSPA, HSDPA, HSUPA, or LTE Advanced. Moreover, substantially all aspects of the subject innovation can comprise legacy telecommunication technologies.

With respect to FIG. 14, in example embodiment 1400, base station AP 1410 can receive and transmit signal(s) (e.g., traffic and control signals) from and to wireless devices, access terminals, wireless ports and routers, etc., through a set of antennas $1412_1$-$1412_N$. It should be appreciated that while antennas $1412_1$-$1412_N$ are a part of communication platform 1425, which comprises electronic components and associated circuitry that provides for processing and manipulating of received signal(s) (e.g., a packet flow) and signal(s) (e.g., a broadcast control channel) to be transmitted. In an aspect, communication platform 1425 comprises a transmitter/receiver (e.g., a transceiver) 1466 that can convert signal(s) from analog format to digital format upon reception, and from digital format to analog format upon transmission. In addition, receiver/transmitter 1466 can divide a single data stream into multiple, parallel data streams, or perform the reciprocal operation. Coupled to transceiver 1466 is a multiplexer/demultiplexer 1467 that facilitates manipulation of signal in time and frequency space. Electronic component 1467 can multiplex information (data/traffic and control/signaling) according to various multiplexing schemes such as time division multiplexing (TDM), frequency division multiplexing (FDM), orthogonal frequency division multiplexing (OFDM), code division multiplexing (CDM), space division multiplexing (SDM). In addition, mux/demux component 1467 can scramble and spread information (e.g., codes) according to substantially any code known in the art; e.g., Hadamard-Walsh codes, Baker codes, Kasami codes, polyphase codes, and so on. A modulator/demodulator 1468 is also a part of operational group 1425, and can modulate information according to multiple modulation techniques, such as frequency modulation, amplitude modulation (e.g., M-ary quadrature amplitude modulation (QAM), with M a positive integer), phase-shift keying (PSK), and the like.

Figure 15:
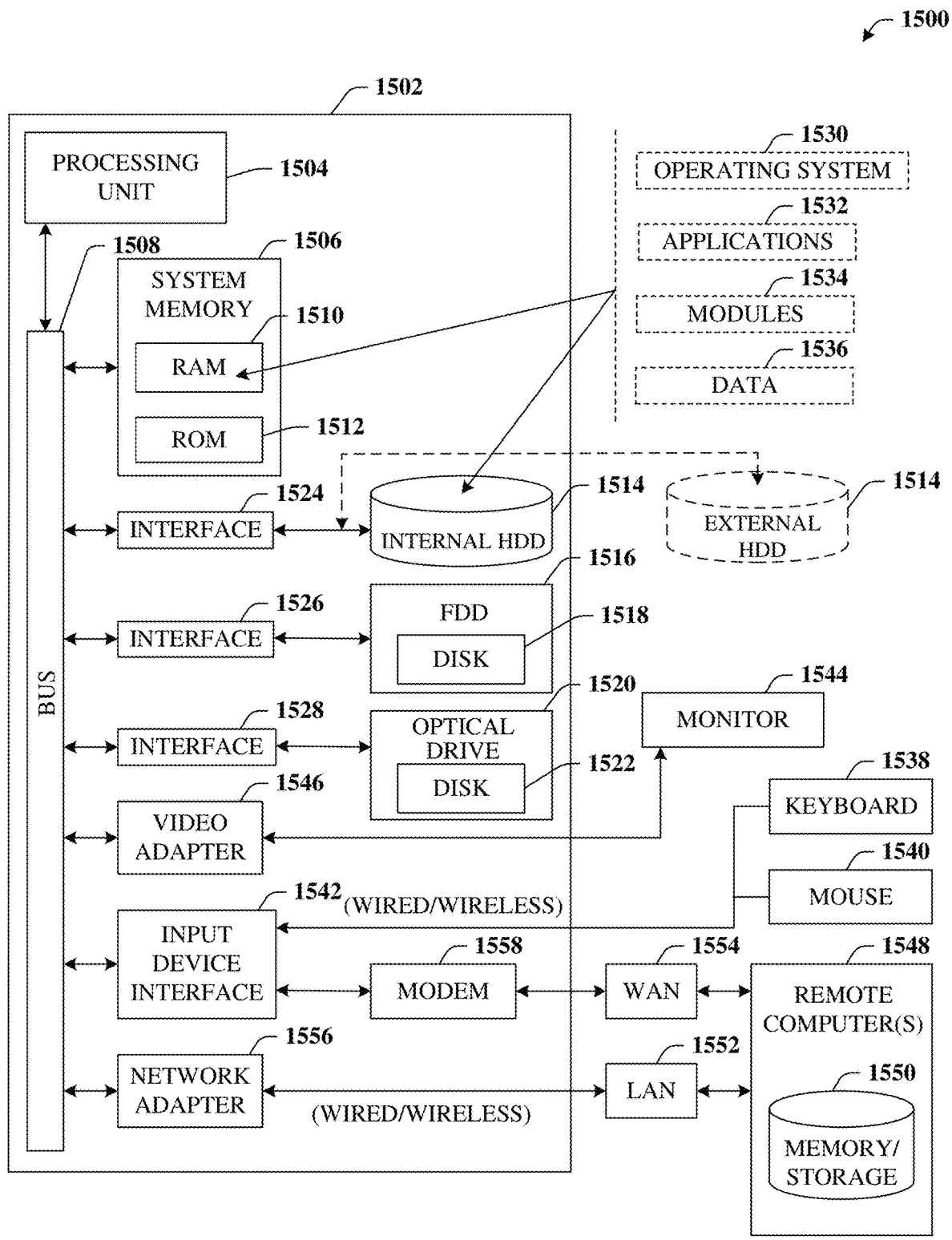
FIG. 15 illustrates an example block diagram of a computer operable to execute certain embodiments of this disclosure.

Referring now to FIG. 15, there is illustrated a block diagram of an exemplary computer system operable to execute the disclosed architecture. In order to provide additional context for various aspects of the disclosed subject matter, FIG. 15 and the following discussion are intended to provide a brief, general description of a suitable computing environment 1500 in which the various aspects of the disclosed subject matter can be implemented. Additionally, while the disclosed subject matter described above may be suitable for application in the general context of computer-executable instructions that may run on one or more computers, those skilled in the art will recognize that the disclosed subject matter also can be implemented in combination with other program modules and/or as a combination of hardware and software.

Generally, program modules comprise routines, programs, components, data structures, etc., that perform particular tasks or implement particular abstract data types. Moreover, those skilled in the art will appreciate that the inventive methods can be practiced with other computer system configurations, including single-processor or multi-processor computer systems, minicomputers, mainframe computers, as well as personal computers, hand-held computing devices, microprocessor-based or programmable consumer electronics, and the like, each of which can be operatively coupled to one or more associated devices.

The illustrated aspects of the disclosed subject matter may also be practiced in distributed computing environments where certain tasks are performed by remote processing devices that are linked through a communications network. In a distributed computing environment, program modules can be located in both local and remote memory storage devices.

A computer typically comprises a variety of computer readable media. Computer readable media can be any available media that can be accessed by the computer and comprises both volatile and nonvolatile media, removable and non-removable media. By way of example, and not limitation, computer-readable media can comprise computer storage media and communication media. Computer storage media can comprise either volatile or nonvolatile, removable and non-removable media implemented in any method or technology for storage of information such as computer-readable instructions, data structures, program modules or other data. Computer storage media comprises, but is not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and comprises any information delivery media. The term "modulated data signal" means a signal that has one or more of its characteristics set or changed in such a manner as to encode information in the signal. By way of example, and not limitation, communication media comprises wired media such as a wired network or direct-wired connection, and wireless media such as acoustic, RF, infrared and other wireless media. Combinations of the any of the above should also be included within the scope of computer-readable media.

Still referring to FIG. 15, the exemplary environment 1500 for implementing various aspects of the disclosed subject matter comprises a computer 1002, the computer 1502 including a processing unit 1504, a system memory 1506 and a system bus 1508. The system bus 1508 couples to system components including, but not limited to, the system memory 1506 to the processing unit 1504. The processing unit 1504 can be any of various commercially available processors. Dual microprocessors and other multi-processor architectures may also be employed as the processing unit 1504.

The system bus 1508 can be any of several types of bus structure that may further interconnect to a memory bus (with or without a memory controller), a peripheral bus, and a local bus using any of a variety of commercially available bus architectures. The system memory 1506 comprises read-only memory (ROM) 1510 and random access memory (RAM) 1512. A basic input/output system (BIOS) is stored in a non-volatile memory 1510 such as ROM, EPROM, EEPROM, which BIOS contains the basic routines that help to transfer information between elements within the computer 1502, such as during start-up. The RAM 1512 can also comprise a high-speed RAM such as static RAM for caching data.

The computer 1502 further comprises an internal hard disk drive (HDD) 1514 (e.g., EIDE, SATA), which internal hard disk drive 1514 may also be configured for external use in a suitable chassis (not shown), a magnetic floppy disk drive (FDD) 1516, (e.g., to read from or write to a removable diskette 1518) and an optical disk drive 1520, (e.g., reading a CD-ROM disk 1522 or, to read from or write to other high capacity optical media such as the DVD). The hard disk drive 1514, magnetic disk drive 1516 and optical disk drive 1520 can be connected to the system bus 1508 by a hard disk drive interface 1524, a magnetic disk drive interface 1526 and an optical drive interface 1528, respectively. The interface 1524 for external drive implementations comprises at least one or both of Universal Serial Bus (USB) and IEEE1394 interface technologies. Other external drive connection technologies are within contemplation of the subject matter disclosed herein.

The drives and their associated computer-readable media provide nonvolatile storage of data, data structures, computer-executable instructions, and so forth. For the computer 1502, the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer, such as zip drives, magnetic cassettes, flash memory cards, cartridges, and the like, may also be used in the exemplary operating environment, and further, that any such media may contain computer-executable instructions for performing the methods of the disclosed subject matter.

A number of program modules can be stored in the drives and RAM 1512, including an operating system 1530, one or more application programs 1532, other program modules 1534 and program data 1536. All or portions of the operating system, applications, modules, and/or data can also be cached in the RAM 1512. It is appreciated that the disclosed subject matter can be implemented with various commercially available operating systems or combinations of operating systems.

A user can enter commands and information into the computer 1502 through one or more wired/wireless input devices, e.g., a keyboard 1538 and a pointing device, such as a mouse 1540. Other input devices (not shown) may comprise a microphone, an IR remote control, a joystick, a game pad, a stylus pen, touch screen, or the like. These and other input devices are often connected to the processing unit 1504 through an input device interface 1542 that is coupled to the system bus 1508, but can be connected by other interfaces, such as a parallel port, an IEEE1394 serial port, a game port, a USB port, an IR interface, etc.

A monitor 1544 or other type of display device is also connected to the system bus 1508 via an interface, such as a video adapter 1546. In addition to the monitor 1544, a computer typically comprises other peripheral output devices (not shown), such as speakers, printers, etc.

The computer 1502 may operate in a networked environment using logical connections via wired and/or wireless communications to one or more remote computers, such as a remote computer(s) 1548. The remote computer(s) 1548 can be a workstation, a server computer, a router, a personal computer, a mobile device, portable computer, microprocessor-based entertainment appliance, a peer device or other common network node, and typically comprises many or all of the elements described relative to the computer 1502, although, for purposes of brevity, only a memory/storage device 1550 is illustrated. The logical connections depicted comprise wired/wireless connectivity to a local area network (LAN) 1552 and/or larger networks, e.g., a wide area network (WAN) 1554. Such LAN and WAN networking environments are commonplace in offices and companies, and facilitate enterprise-wide computer networks, such as intranets, all of which may connect to a global communications network, e.g., the Internet.

When used in a LAN networking environment, the computer 1502 is connected to the local network 1552 through a wired and/or wireless communication network interface or adapter 1556. The adapter 1556 may facilitate wired or wireless communication to the LAN 1552, which may also comprise a wireless access point disposed thereon for communicating with the wireless adapter 1556.

When used in a WAN networking environment, the computer 1502 can comprise a modem 1558, or is connected to a communications server on the WAN 1554, or has other means for establishing communications over the WAN 1554, such as by way of the Internet. The modem 1558, which can be internal or external and a wired or wireless device, is connected to the system bus 1508 via the serial port interface 1542. In a networked environment, program modules depicted relative to the computer 1502, or portions thereof, can be stored in the remote memory/storage device 1550. It will be appreciated that the network connections shown are exemplary and other means of establishing a communications link between the computers can be used.

The computer 1502 is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This comprises at least Wi-Fi and Bluetooth™ wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE802.11 (a, b, g, n, etc.) to provide secure, reliable, fast wireless connectivity. A Wi-Fi network can be used to connect computers to each other, to the Internet, and to wired networks (which use IEEE802.3 or Ethernet). Wi-Fi networks operate in the unlicensed 2.4 and 5 GHz radio bands, at an 11 Mbps (802.11b) or 54 Mbps (802.11a) data rate, for example, or with products that contain both bands (dual band), so the networks can provide real-world performance similar to the basic "10BaseT" wired Ethernet networks used in many offices.

What has been described above comprises examples of the various embodiments. It is, of course, not possible to describe every conceivable combination of components or methodologies for purposes of describing the embodiments, but one of ordinary skill in the art may recognize that many further combinations and permutations are possible. Accordingly, the detailed description is intended to embrace all such alterations, modifications, and variations that fall within the spirit and scope of the appended claims.

As used in this application, the terms "system," "component," "interface," and the like are generally intended to refer to a computer-related entity or an entity related to an operational machine with one or more specific functionalities. The entities disclosed herein can be either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers. These components also can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry that is operated by software or firmware application(s) executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. An interface can comprise input/output (I/O) components as well as associated processor, application, and/or API components.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from by a computing device.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor also can be implemented as a combination of computing processing units.

In the subject specification, terms such as "store," "data store," "data storage," "database," "repository," "queue", and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory. In addition, memory components or memory elements can be removable or stationary. Moreover, memory can be internal or external to a device or component, or removable or stationary. Memory can comprise various types of media that are readable by a computer, such as hard-disc drives, zip drives, magnetic cassettes, flash memory cards or other types of memory cards, cartridges, or the like.

By way of illustration, and not limitation, nonvolatile memory can comprise read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments comprise a system as well as a computer-readable medium having computer-executable instructions for performing the acts and/or events of the various methods.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can comprise, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

On the other hand, communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communications media comprise wired media, such as a wired network or direct-wired connection, and wireless media such as acoustic, RF, infrared and other wireless media Further, terms like "user equipment," "user device," "mobile device," "mobile," "station," "access terminal," "terminal," "handset," and similar terminology, generally refer to a wireless device utilized by a subscriber or user of a wireless communication network or service to receive or convey data, control, voice, video, sound, gaming, or substantially any data-stream or signaling-stream. The foregoing terms are utilized interchangeably in the subject specification and related drawings. Likewise, the terms "access point," "node B," "base station," "evolved Node B," "cell," "cell site," and the like, can be utilized interchangeably in the subject application, and refer to a wireless network component or appliance that serves and receives data, control, voice, video, sound, gaming, or substantially any data-stream or signaling-stream from a set of subscriber stations. Data and signaling streams can be packetized or frame-based flows. It is noted that in the subject specification and drawings, context or explicit distinction provides differentiation with respect to access points or base stations that serve and receive data from a mobile device in an outdoor environment, and access points or base stations that operate in a confined, primarily indoor environment overlaid in an outdoor coverage area. Data and signaling streams can be packetized or frame-based flows.

Furthermore, the terms "user," "subscriber," "customer," "consumer," and the like are employed interchangeably throughout the subject specification, unless context warrants particular distinction(s) among the terms. It should be appreciated that such terms can refer to human entities, associated devices, or automated components supported through artificial intelligence (e.g., a capacity to make inference based on complex mathematical formalisms) which can provide simulated vision, sound recognition and so forth. In addition, the terms "wireless network" and "network" are used interchangeable in the subject application, when context wherein the term is utilized warrants distinction for clarity purposes such distinction is made explicit.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while a particular feature may have been disclosed with respect to only one of several implementations, such feature may be combined with one or more other features of the other implementations as may be desired and advantageous for any given or particular application. Furthermore, to the extent that the terms "includes" and "including" and variants thereof are used in either the detailed description or the claims, these terms are intended to be inclusive in a manner similar to the term "comprising."

What is claimed is:

1. A device, comprising:
a client interface, situated at an access point site, configured to interface to transceiver devices of the access point site that receive analog radio signals from user equipment;
a network interface configured to interface to network equipment;
a processor; and
a memory that stores executable instructions that, when executed by the processor, facilitate performance of operations, comprising:
receiving, via the client interface, the analog radio signals, comprising:
a first analog signal received from a first transceiver device of the transceiver devices of the access point site; and
a second analog signal received from a second transceiver device of the transceiver devices of the access point site, wherein the second transceiver device differs from the first transceiver device;
transforming an analog signal, of the analog radio signals, to a digital signal comprising packets of data;
based on a type of the network equipment, determine a protocol, from among multiple protocols, by which to encapsulate a packet of the packets;
transmitting, via the network interface, an encapsulated packet representative of the packet that is encapsulated according to the protocol that is determined based on the type of the network equipment; and
instantiating a virtual machine configured to execute a virtual network function, wherein the virtual network function performs a carrier aggregation procedure that aggregates spectrums used to communicate between a user equipment of the user equipment and the transceiver devices of the access point site in response to examining a service allocation assigned to a subscriber entity associated with the user equipment.

2. The device of claim 1, wherein the network equipment operates according to a fifth generation cellular protocol and the protocol is a radio-over-Ethernet protocol.

3. The device of claim 1, wherein the network equipment operates according to a long term evolution cellular protocol and the protocol is an Ethernet protocol.

4. The device of claim 1, wherein the digital signal is formatted according to a common public radio interface protocol.

5. The device of claim 1, wherein the digital signal is formatted according to an evolved common public radio interface protocol.

6. The device of claim 1, wherein a first group of the transceiver devices comprising the first transceiver device serves a first sector of the access point site and a second group of the transceiver devices comprising the second transceiver device serves a second sector of the access point site.

7. The device of claim 6, wherein the first transceiver device is configured to support multiple frequency bands or configured to support a single frequency band.

8. The device of claim 1, wherein the virtual network function performs a handover procedure that hands over service of a user equipment of the user equipment from a serving transceiver device to a neighbor transceiver device in response to client data received from the user equipment and network data of devices of the access point site.

9. The device of claim 1, wherein the virtual network function performs a load balancing procedure that mitigates imbalances of resource utilization between devices of the access point site.

10. A non-transitory machine-readable medium, comprising executable instructions that, when executed by a processor, facilitate performance of operations, comprising:
receiving analog signals comprising a first analog signal received from a first transceiver device of an access point device and a second analog signal received from a second transceiver device of the access point device, wherein the second transceiver device differs from the first transceiver device, and wherein the first transceiver device and the second transceiver device receive the analog signals from user equipment;
converting the analog signals to respective digital signals;
determining a type of a target device configured to receive the respective digital signals;

encapsulating the respective digital signals according to a protocol that is selected from among multiple protocols based on the type of the target device, resulting in an encapsulated signal;

transmitting the encapsulated signal to the target device, and instantiating a virtual machine configured to execute a virtual network function, wherein the virtual network function performs a carrier aggregation procedure that aggregates spectrums used to communicate between a user equipment of the user equipment and the transceiver devices of the access point site in response to examining a service allocation assigned to a subscriber entity associated with the user equipment.

11. The non-transitory machine-readable medium of claim 10, wherein the analog signals are determined to be configured according to a long term evolution protocol and the converting the analog signals to the respective digital signals comprises converting the analog signals to the respective digital signals formatted according to a common public radio interface protocol.

12. The non-transitory machine-readable medium of claim 11, wherein the encapsulating the respective digital signals comprises encapsulating the respective digital signals according to an Ethernet protocol.

13. The non-transitory machine-readable medium of claim 10, wherein the analog signals are determined to be configured according to a fifth generation wireless communication protocol and the converting the analog signals to the respective digital signals comprises converting the analog signals to the respective digital signals formatted according to an evolved common public radio interface protocol.

14. The non-transitory machine-readable medium of claim 13, wherein the encapsulating the respective digital signals comprises encapsulating the respective digital signals according to a radio-over-Ethernet protocol.

15. The non-transitory machine-readable medium of claim 10, wherein the respective digital signals are formatted according to a common public radio interface protocol.

16. The non-transitory machine-readable medium of claim 10, wherein the respective digital signals are formatted according to an evolved common public radio interface protocol.

17. A method, comprising:

facilitating, by a device situated at an access point site and comprising a processor, receiving analog signals comprising a first analog signal received from a first transceiver device of the access point site and a second analog signal received from a second transceiver device that is situated at the access point site and that differs from the first transceiver device, wherein the first transceiver device and the second transceiver device receive the analog signals from user equipment;

determining, by the device, a type associated with the analog signals;

transforming, by the device, the analog signals to digital signals formatted according to a first protocol that is selected based on the type;

in response to an encapsulation procedure performed on the digital signals, generating, by the device, encapsulated signals formatted according to a second protocol that is determined based on the type; and instantiating, by the device, a virtual machine configured to execute a virtual network function according to a network functions virtualization protocol, wherein the virtual network function is a carrier aggregation function, and wherein the method further comprises aggregating, by the device, spectrums used to communicate between a user equipment of the user equipment and the first transceiver device according to the carrier aggregation function.

18. The method of claim 17, wherein the virtual network function is a handover function, and wherein the method further comprises transferring, by the device, service of a user equipment of the user equipment from a serving transceiver device to a neighbor transceiver device according to the handover function.

19. The method of claim 17, wherein the virtual machine is further configured to execute a handover function comprising transferring, by the device, service of a user equipment of the user equipment from a serving transceiver device to a neighbor transceiver device according to the handover function.

20. The method of claim 17, wherein the virtual machine is further configured to execute a load balancing function comprising mitigating, by the device, imbalances of resource utilization between devices of the access point site.

* * * * *